US012169214B2

United States Patent
Nichols et al.

(10) Patent No.: US 12,169,214 B2
(45) Date of Patent: Dec. 17, 2024

(54) METHOD AND APPARATUS FOR NONINVASIVE DETERMINATION OF UTILIZATION

(71) Applicants: Elemental Machines, Inc., Salem, NH (US); Alex Nichols, Somerville, MA (US); Casey Peters, Caldwell, NJ (US); Lauren Lisle, Concord, MA (US); John Sakalowsky, Newton, MA (US); Ian Harding, Wells (GB); Sridhar Iyengar, Salem, NH (US)

(72) Inventors: Alex Nichols, Somerville, MA (US); Casey Peters, Caldwell, NJ (US); Lauren Lisle, Concord, MA (US); John Sakalowsky, Newton, MA (US); Ian Harding, Wells (GB); Sridhar Iyengar, Salem, NH (US)

(73) Assignee: Elemental Machines, Inc., Cambridge, MA (US)

( * ) Notice: Subject to any disclaimer, the term of this patent is extended or adjusted under 35 U.S.C. 154(b) by 115 days.

(21) Appl. No.: 17/800,205

(22) PCT Filed: Feb. 17, 2021

(86) PCT No.: PCT/US2021/018366
§ 371 (c)(1),
(2) Date: Aug. 16, 2022

(87) PCT Pub. No.: WO2021/167973
PCT Pub. Date: Aug. 26, 2021

(65) Prior Publication Data
US 2023/0204646 A1 Jun. 29, 2023

Related U.S. Application Data

(60) Provisional application No. 62/979,653, filed on Feb. 21, 2020.

(51) Int. Cl.
*G01R 31/327* (2006.01)
*G01R 29/08* (2006.01)

(52) U.S. Cl.
CPC ..... *G01R 29/0878* (2013.01); *G01R 29/0871* (2013.01); *G05B 2219/37124* (2013.01)

(58) Field of Classification Search
CPC ........... G01R 29/0878; G01R 29/0871; G01R 19/15; G01R 19/2513; G01R 1/04
See application file for complete search history.

(56) References Cited

U.S. PATENT DOCUMENTS 10,112,496 B2 * 10/2018 Nguyen ................. B60L 53/665
2007/0170533 A1 * 7/2007 Doogue ................. G01R 33/06
257/422

(Continued)

FOREIGN PATENT DOCUMENTS

EP 2278344 A2 1/2011

*Primary Examiner* — Dominic E Hawkins
(74) *Attorney, Agent, or Firm* — Anderson Patent Law Firm LLC

(57) ABSTRACT

An electromagnetic apparatus (EMA) for measuring electromagnetic properties of an electrical conductor such as a power cord is provided. Methods of using the EMA are also provided. The EMA includes a plurality of electromagnetic sensors (EMSs) disposed in an array along a length and a width of the EMA. The EMA further includes circuitry such as a microprocessor, communication circuitry, and power circuitry. The circuitry is in electrical communication with the EMSs.

26 Claims, 18 Drawing Sheets

(56) References Cited

U.S. PATENT DOCUMENTS

| | | | |
|---|---|---|---|
| 2009/0251308 A1 | 10/2009 | Schweitzer, III | |
| 2013/0147460 A1 | 6/2013 | Blanchard | |
| 2014/0159920 A1 | 6/2014 | Furui et al. | |
| 2014/0225603 A1 | 8/2014 | Auguste et al. | |
| 2014/0261551 A1* | 9/2014 | Usselman | B23Q 11/0046 |
| | | | 15/319 |
| 2015/0008911 A1* | 1/2015 | Majer | G01R 19/0092 |
| | | | 324/234 |
| 2015/0200489 A1 | 7/2015 | Cox et al. | |
| 2016/0238638 A1* | 8/2016 | Scheiermann | G01R 19/15 |
| 2018/0120362 A1* | 5/2018 | Viegas | G01R 15/207 |
| 2019/0133424 A1 | 5/2019 | Patel et al. | |
| 2019/0212372 A1* | 7/2019 | Bilbao De Mendizabal | |
| | | | G01R 33/09 |

* cited by examiner

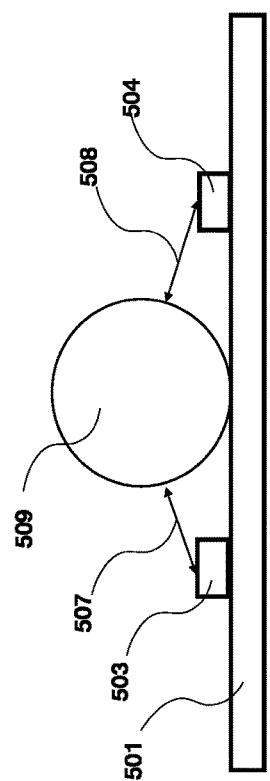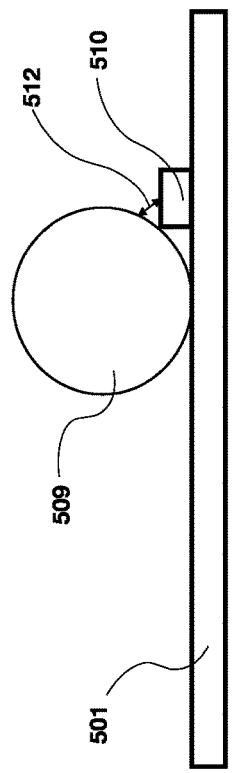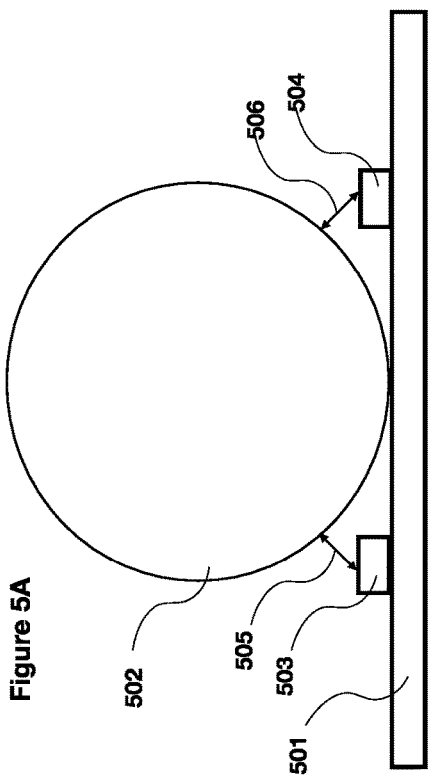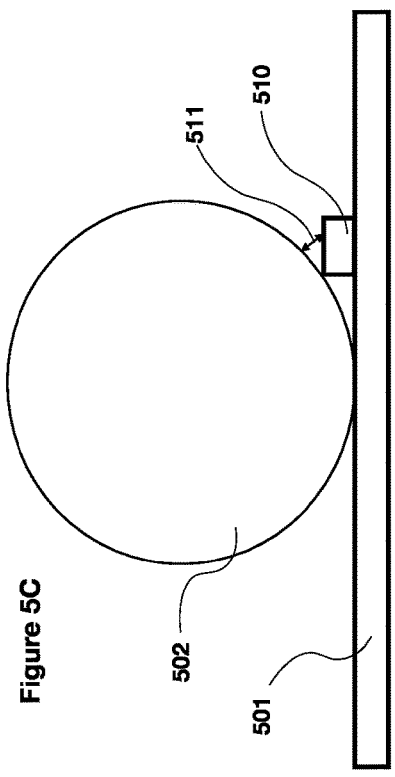
Figure 5

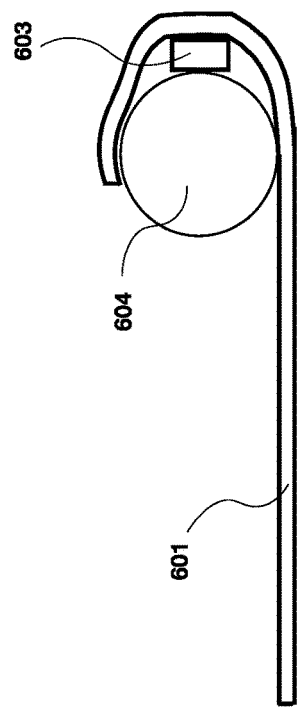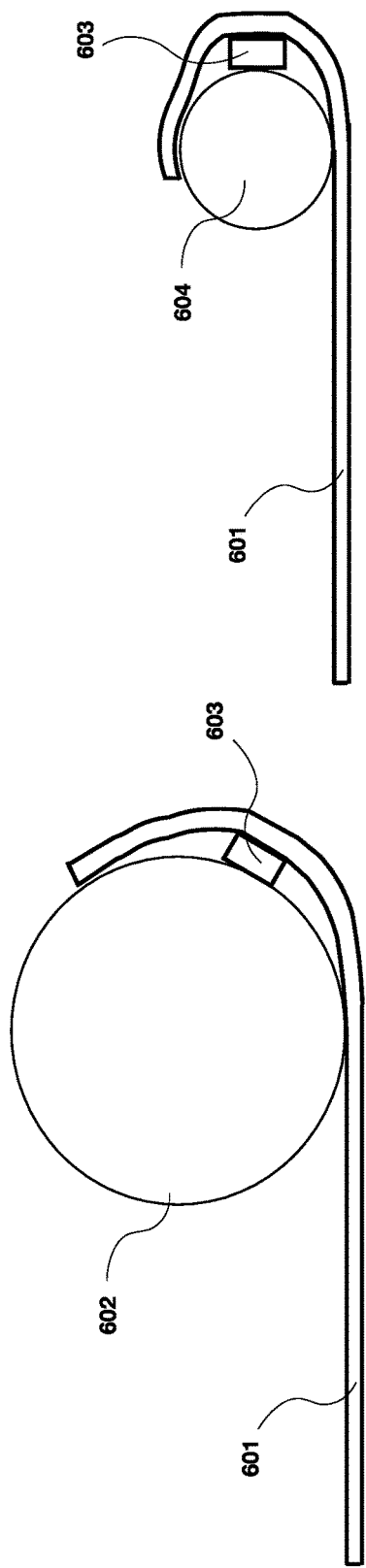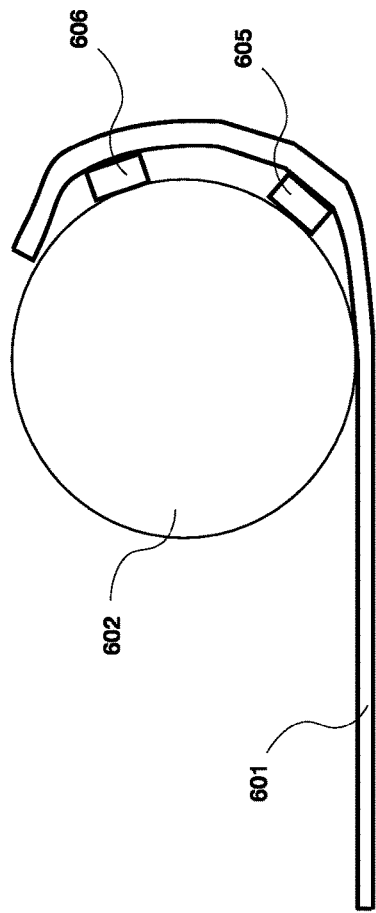
Figure 6

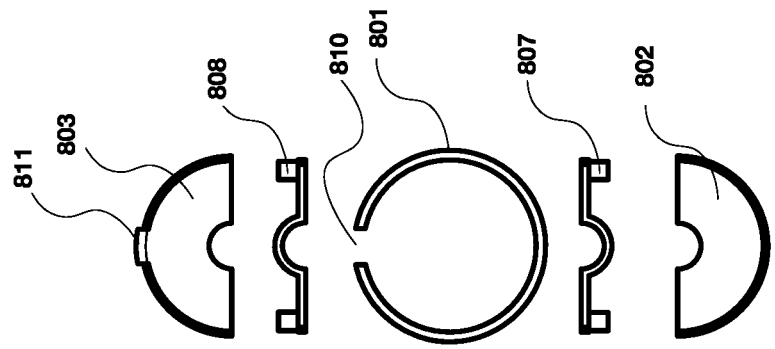
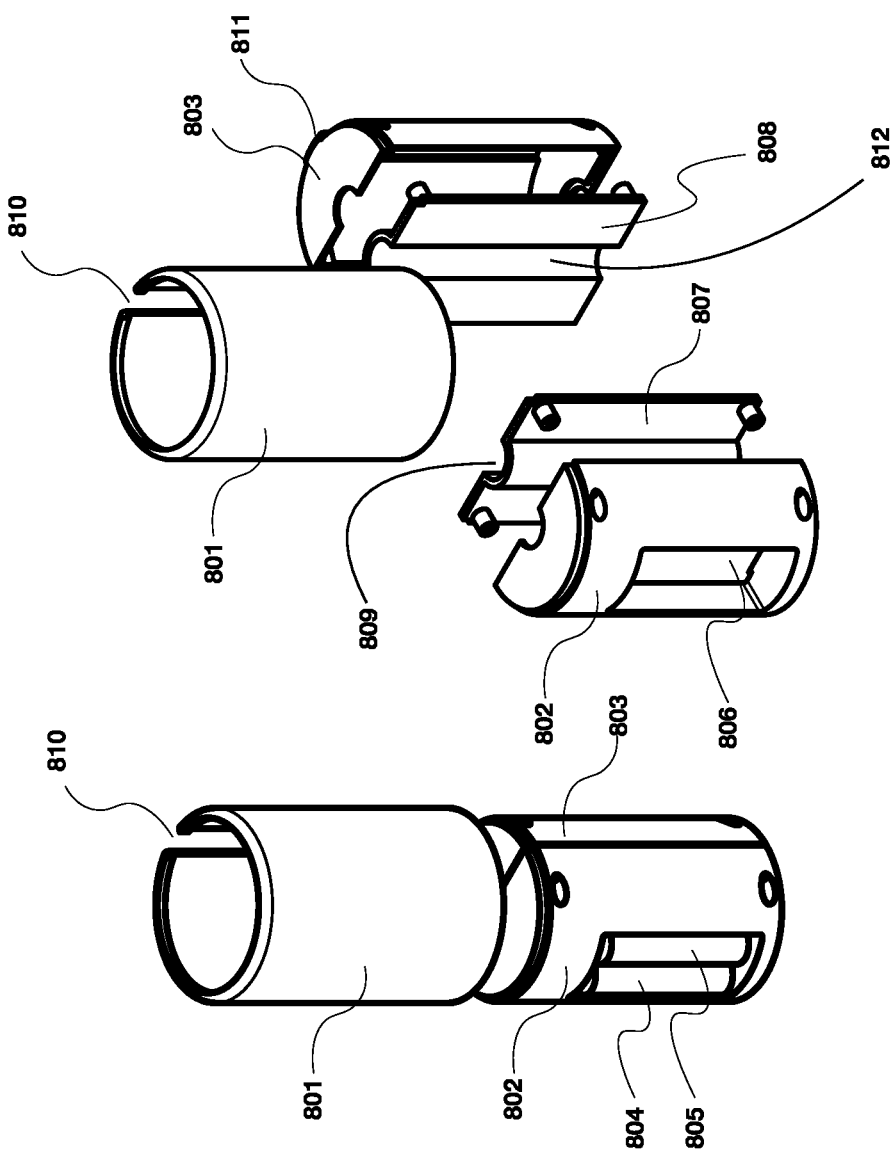
Figure 8C
Figure 8B
Figure 8A
Figure 8

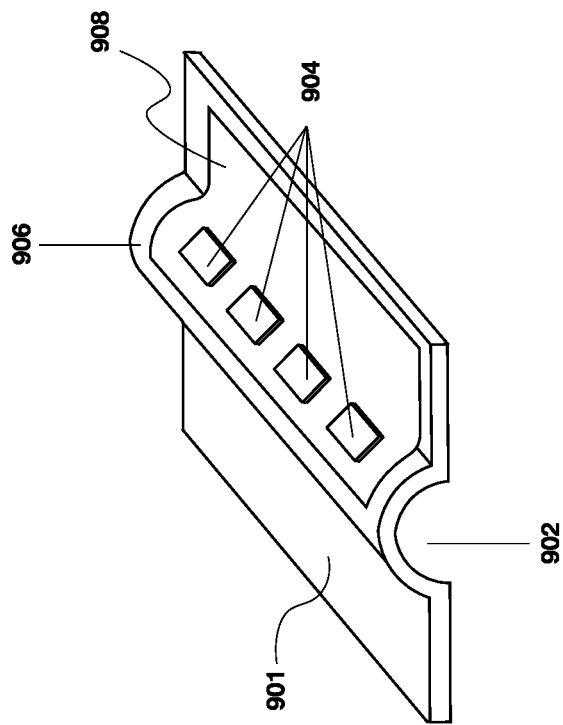
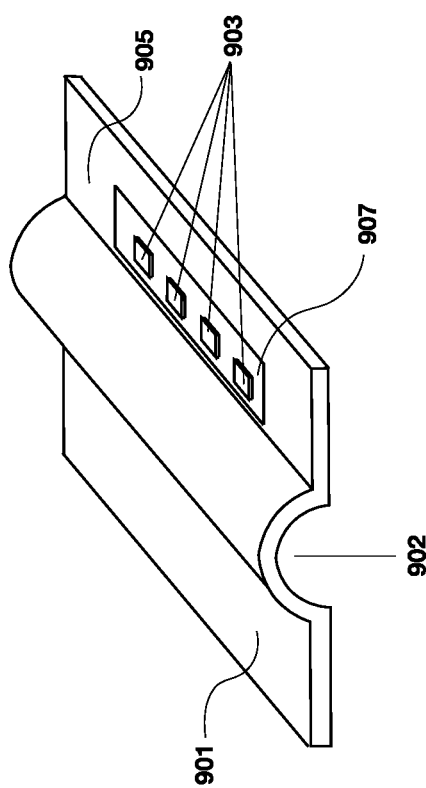
Figure 9B
Figure 9A
Figure 9

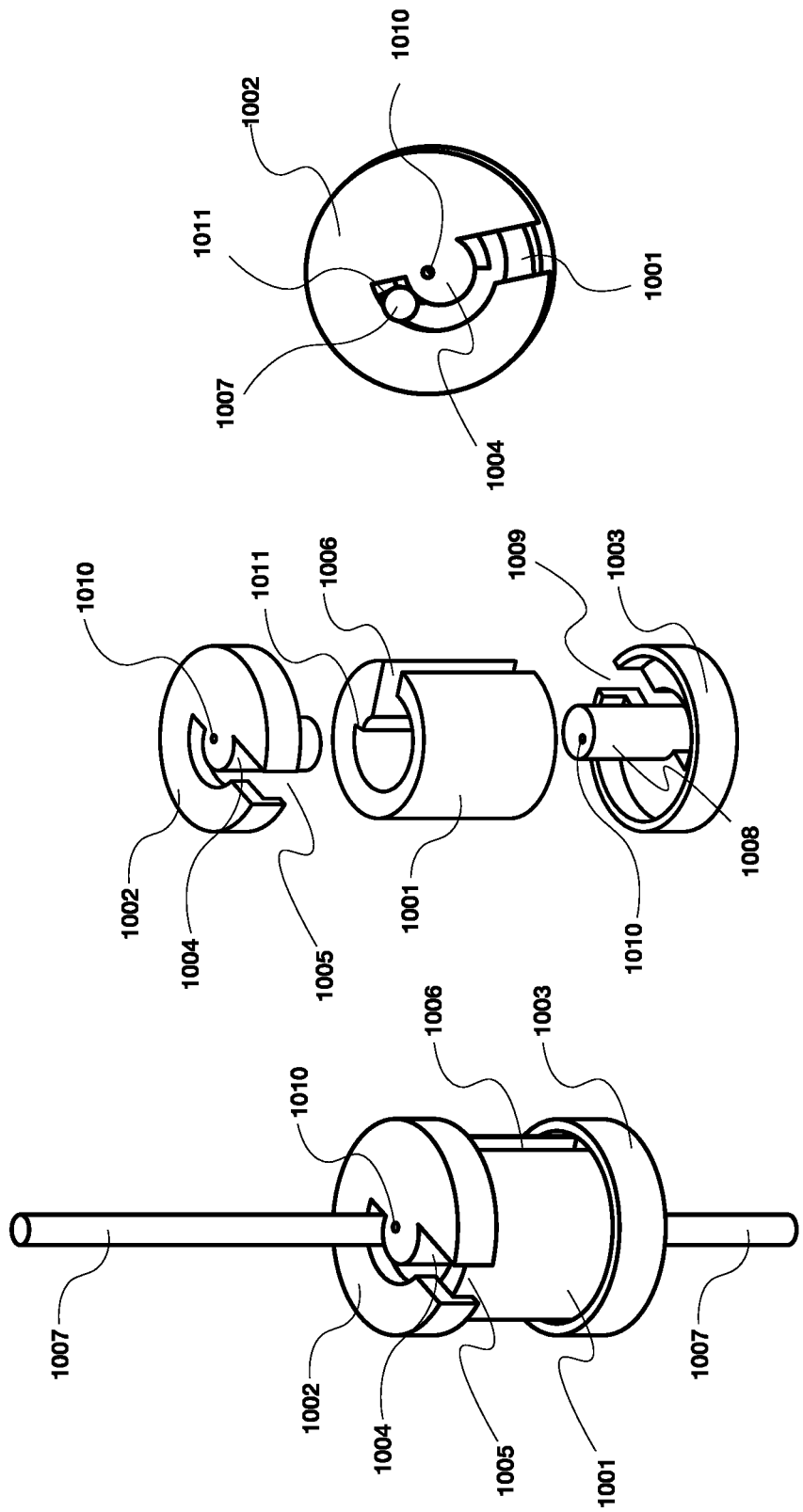

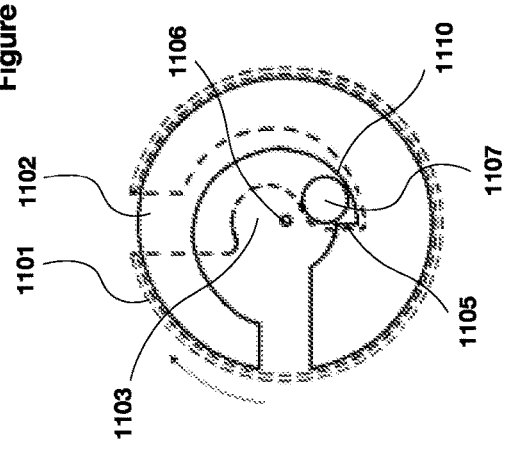
Figure 11A
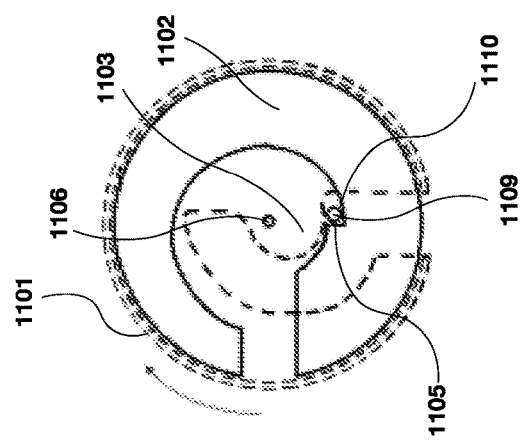
Figure 11B
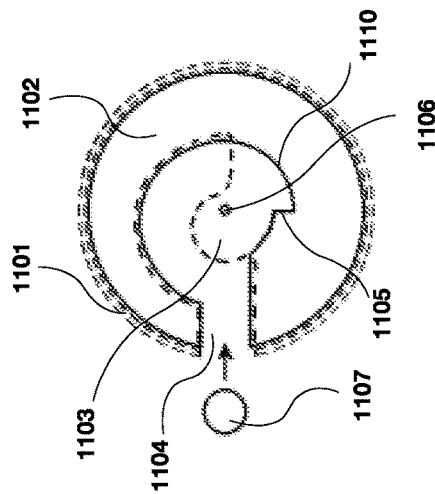
Figure 11C
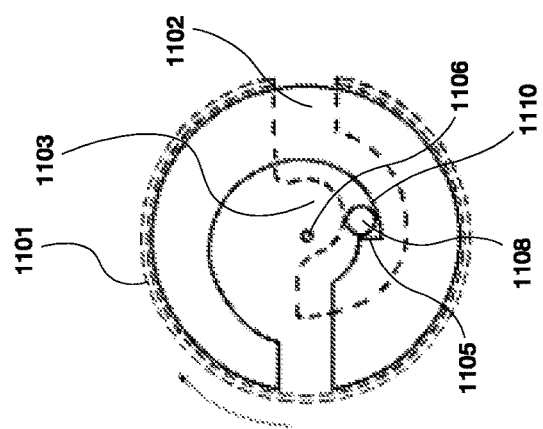
Figure 11D
Figure 11

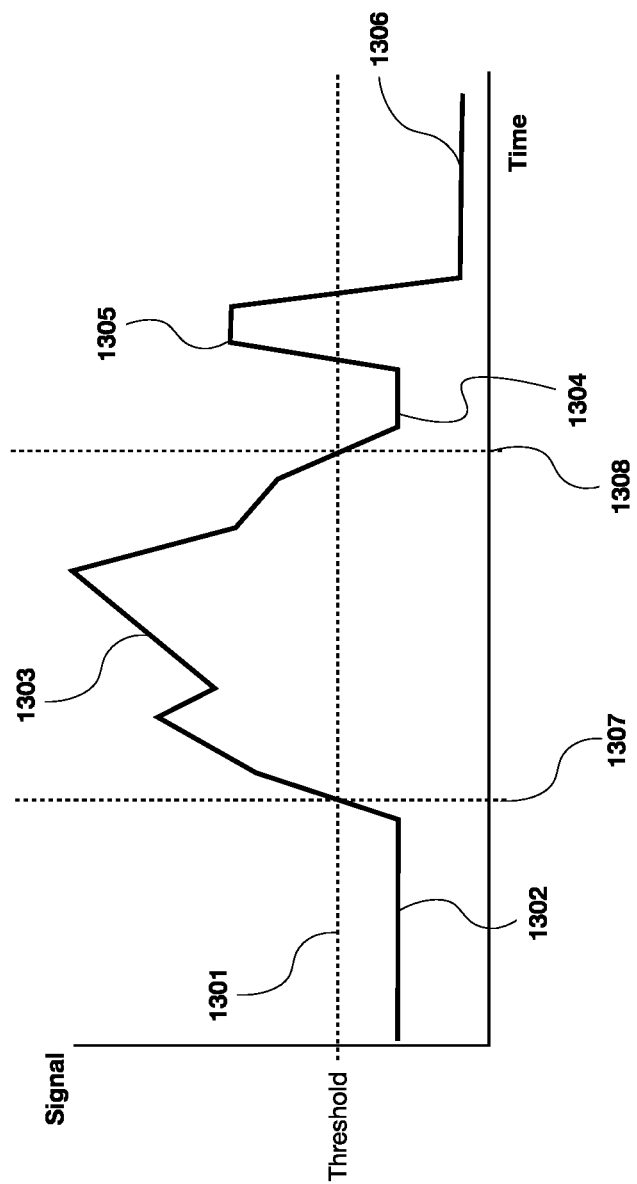

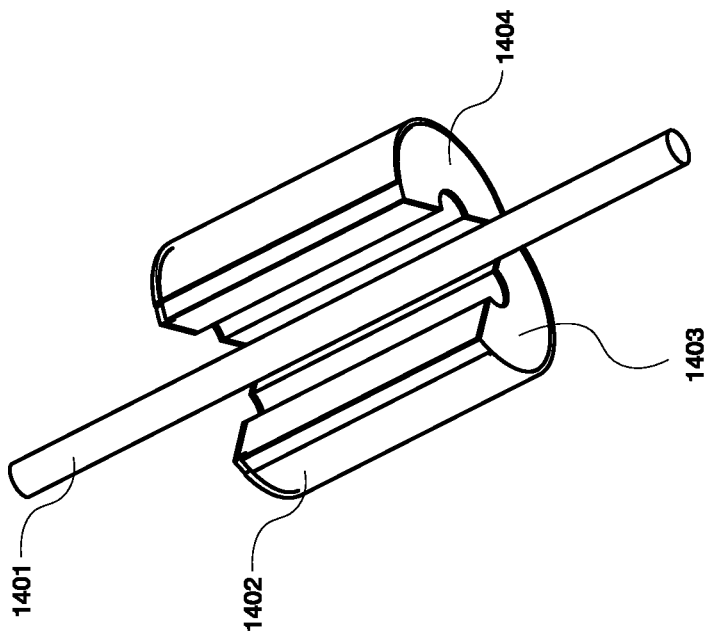
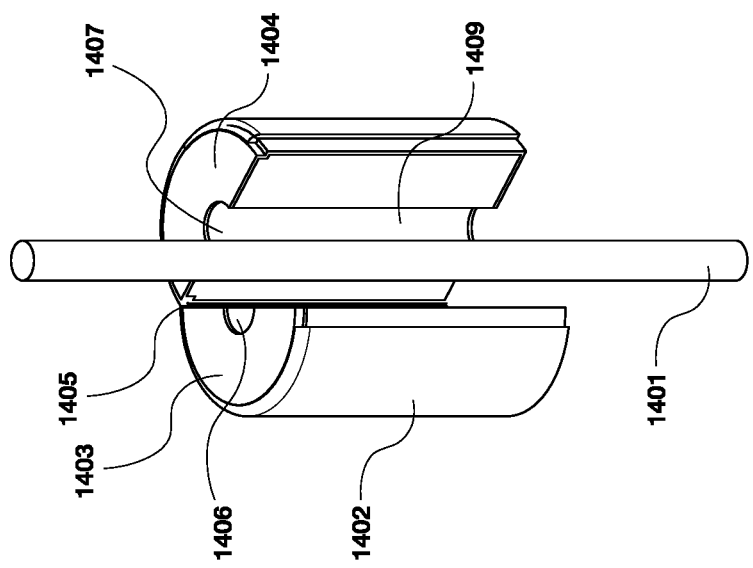
Figure 14B
Figure 14A
Figure 14

METHOD AND APPARATUS FOR NONINVASIVE DETERMINATION OF UTILIZATION

CROSS-REFERENCE TO RELATED APPLICATIONS AND PRIORITY

This application is a non-provisional application of and claiming priority to U.S. Prov. Pat. App. Ser. No. 62/979,653 (ELMA.P-018-PV) filed on Feb. 21, 2020, which is incorporated herein by reference for all purposes. Any external reference mentioned herein, including for example websites, articles, reference books, textbooks, granted patents, and patent applications are incorporated in their entireties herein by reference for all purposes.

BACKGROUND OF THE INVENTION

There is a need to determine parameters surrounding machine and/or instrument usage. These needs include, for example, knowledge and/or parameters related to: when it is used (day/time/start/stop); how long it is used (duration); what functions is it doing when it is being used (e.g. more than just is it on or off); how is it being used or what settings are on/off during use. An example device is a centrifuge and desired information parameters surrounding such device include whether the device in on/off, whether refrigeration has been turned on or if it is being run at room temp, and to what extent is it being used (e.g. what is the rotation rate of the centrifuge, e.g. fast or slow).

While many machines/instruments have digital or analog data output ports, there are many that do not have any means of communicating information to the outside world (e.g. older machines without data ports etc.). For these types of machines, one commonly used method of determining usage metrics is by directly measuring the power and/or current that it draws. Various manufacturers offer "smart plugs" that can be plugged into a wall socket, into which the machine can then be subsequently plugged in. These devices generally measure the current that is passed through them (from wall power to the connected machine), and have some means of communication (usually wireless, e.g. wifi, RF, Bluetooth, BLE, ANT, etc.) to transmit a measure of the power and/or current drawn by the machine. Examples of consumer-grade "smart plugs" include WEMO made by Belkin, and the Amazon Smart Plug. Generally consumer-grade "smart plugs" are used for controlling appliances like lights, radios, and TVs.

Split core current transformers (SCCTs) are another type of sensor system for measuring current passing through a conductor. SCCTs can be clamped around a supply line of an electrical load to provide an indication of how much current is passing through it. SCCTs work by acting as an inductor and responding to the magnetic field around a current-carrying conductor. By reading the amount of current being produced by the coil, SCCTs can calculate how much current is passing through the conductor. However, this requires the split core transformer device to be looped around an individual current-carrying conductor, which in turn may require a power cord to be cut open to expose the internal conductors, as shown in FIG. 1. FIG. 1 shows a power cord 102 that has been cut open to expose its three conductors 103, 104, and 105. Split core transformer 101 is looped around one of the conductors 103.

One company called Sense (sense.com) measures the entire current coming into a building using split core current transformers. They measure the entire current flowing into a building and then determine what portion of the current is being used by different appliances. They do this by analyzing unique fingerpints of the current signal that are associated with each different type of appliance. For example, the current signal for a toaster may be very different than the current signal for a coffee machine. However, this requires an extensive library of current signal fingerprints for different types of appliances, which is further complicated by the fact that each type of appliance may have a different signal fingerprint depending on the model number and manufacturer.

These prior art methods of determining current flow are invasive and difficult implement across a facility. Furthermore, such invasive current measurement systems lead to liability and psychological issues. In particular, there is a reluctance to plug an expensive machine into a "smart plug" and then plug that smart plug into a wall, especially since many smart plugs can be bought for under $100. These "smart plugs" many be manufactured to a lesser tolerance than an expensive machine. Accordingly, bridging the power supply of a device that can cost tens-of-thousands to hundreds of thousands of dollars with a device with lower costs/control standards is generally discouraged and in fact some manufacturers of high-end machines state that the warranty is voided if the machine is not directly plugged into the wall.

Next, the safety testing for a "smart plug" that is designed to be in-line with another machine and directly measure current is more burdensome than an apparatus that does not directly plug into wall power. Additionally, "smart plugs" generally communicate via wireless signal (WiFi or Bluetooth, or BLE, for example). Many high-end machines are sensitive to line noise (from the power socket), and as such having an RF transmitter in close proximity to the conductive leads of the machine's plug (e.g. which is typically not shielded) could significantly increase the line noise into the machine. There is a general need to solve these problems in the art.

Accordingly, the present invention solves these and other problems by providing non-invasive systems, methods and apparatuses which can determine and/or estimate power consumption of a device. The term "non-invasive" as it is used herein to determine power consumption of a device means that there is no direct measurement of current that is flowing in/out of a device by an apparatus that is in conductive communication with at least one of the conductors that is used for transmitting current to/from the machine. Instead, the methods and apparatuses described herein indirectly measure physical parameters that are associated with current that is flowing in/out of a device. The methods and apparatuses described herein measure and/or analyze electromagnetic signals (e.g. electromagnetic fields) that are generated when a current is flowing in a conductor that provides power to a machine.

The present invention provides methods and apparatuses that non-invasively measure current flowing into machines using an apparatus that is responsive to an electromagnetic field. In certain embodiments herein described such a device is referred to as an Electromagnetic Apparatus (EMA). Such an EMA can be comprised of at least one sensor (called "EMS" for Electromagnetic Sensor) that is designed to be responsive to different types of electromagnetic fields. Examples of EMSs can include those selected from the group consisting of: a Hall Effect sensor; a Magnetometer; and RF sensors.

Time-varying currents, such as alternating currents (AC), generate electromagnetic fields. AC from the wall is time varying (generally either about 60 Hz (e.g. in the US) or 50 Hz (e.g. in the UK). When current from wall travels along a power cord (to power a machine), there is usually a time varying electromagnetic field that can be picked up by an EMA in proximity to the power cord. This is not a new concept and instead there are devices that provide such non-invasive current measurement using Hall Effect sensors. See for example the current sensor sold under the tradename MODERN DEVICE CURRENT SENSOR at https://moderndevice.com/product/current-sensor/.

The present inventors have discovered that there are several problems, limitations and drawbacks to these types of non-invasive systems which determine current flowing to devices by measuring or the electromagnetic fields created by the flowing current. These problems and limitations include inter alia: the determination of where and how to introduce such a sensor to a power supply line to ensure a correct measurement and/or how to obtain a satisfactory signal; how to determine or to detect if the sensor has been moved or otherwise tampered with after the sensor has been installed; what to do with and where and how to analyze any signal coming from such a sensor.

Solutions to all the above-noted problems have long been desired.

BRIEF SUMMARY OF THE INVENTION

The present invention provides several new methods and apparatuses which address and solve to problems observed in the art.

In a first embodiment, the present invention provides an electromagnetic apparatus (EMA) for measuring electromagnetic properties of a power cord. The EMA has a plurality of electromagnetic sensors (EMSs) disposed in an array along a length and a width of the EMA, and circuitry comprising a microprocessor, communication circuitry, and power circuitry, wherein the circuitry is in electrical communication with the EMSs.

In a second embodiment the present invention provides an electromagnetic (EM) measurement system having any EMA as described herein associated on the length of a power cord supplying power to a machine.

In a third embodiment, the present invention provides a method of attaching an EMA to a power cord of a machine OR a method of forming the EM measurement system as described herein. Either method includes the steps of: attaching an EMA as described anywhere herein along the length of a power cord supplying power to the machine.

In a fourth embodiment, the present invention provides methods of using the herein described EM measurement systems (e.g. the EMA combined with a power cord providing power to a machine. These methods includes any or all of the processes selected from the group consisting of: (A) calibrating the EM measurement system; (B) determining a present operating state of the machine; (C) determining if the EMA has been moved or dislodged from the power cord after its association therewith, etc.

BRIEF DESCRIPTION OF THE DRAWING

FIGS. 2-7B and 14 show electromagnetic (EM) measurement systems containing an electromagnetic apparatus (EMA) and a power cord in accordance with embodiments of the present invention.

FIGS. 7C-9B show EMAs in accordance with embodiments of the present invention

FIGS. 10A-11D and 14 show embodiments of the present invention wherein the EMA has a housing, optionally utilizing a cam device, to bias a power cord toward the electromagnetic sensors (EMSs) of the EMA.

FIGS. 12-13 and 15-18 show data plots of signals etc. useful to employ method embodiments as herein described.

DETAILED DESCRIPTION OF THE INVENTION

The present invention provides solutions to the above-described problems in the art and provides methods, processes, and devices to measure and/or estimate the usage of a machine, instrument or piece of equipment (e.g. all known and referred to as a "device" or "machine" or "instrument" throughout the specification) in a non-invasive manner. Furthermore, the present invention provides methods, processes, and devices to derive and/or infer information about the nature of the machine's usage from an electrical conductor, such as a power cord supplying electricity to the machine.

The methods and apparatuses described herein also can preferably analyze magnetic fields to estimate or determine useful quantities and/or parameters, selected from the group consisting of: whether a machine is on or off, optionally including duration of operation and duty cycle; different modes of operation that a machine is operating in; the amount of power and/or current that a machine is consuming during different modes of operation. Furthermore, the electromagnetic properties may be converted into estimations or determinations of current flow within the electrical conductor (e.g. power cord) and/or current use of the machine. The estimated and/or determined current use may then be used estimate or determine the useful quantities and/or parameters described above.

Figure 1:
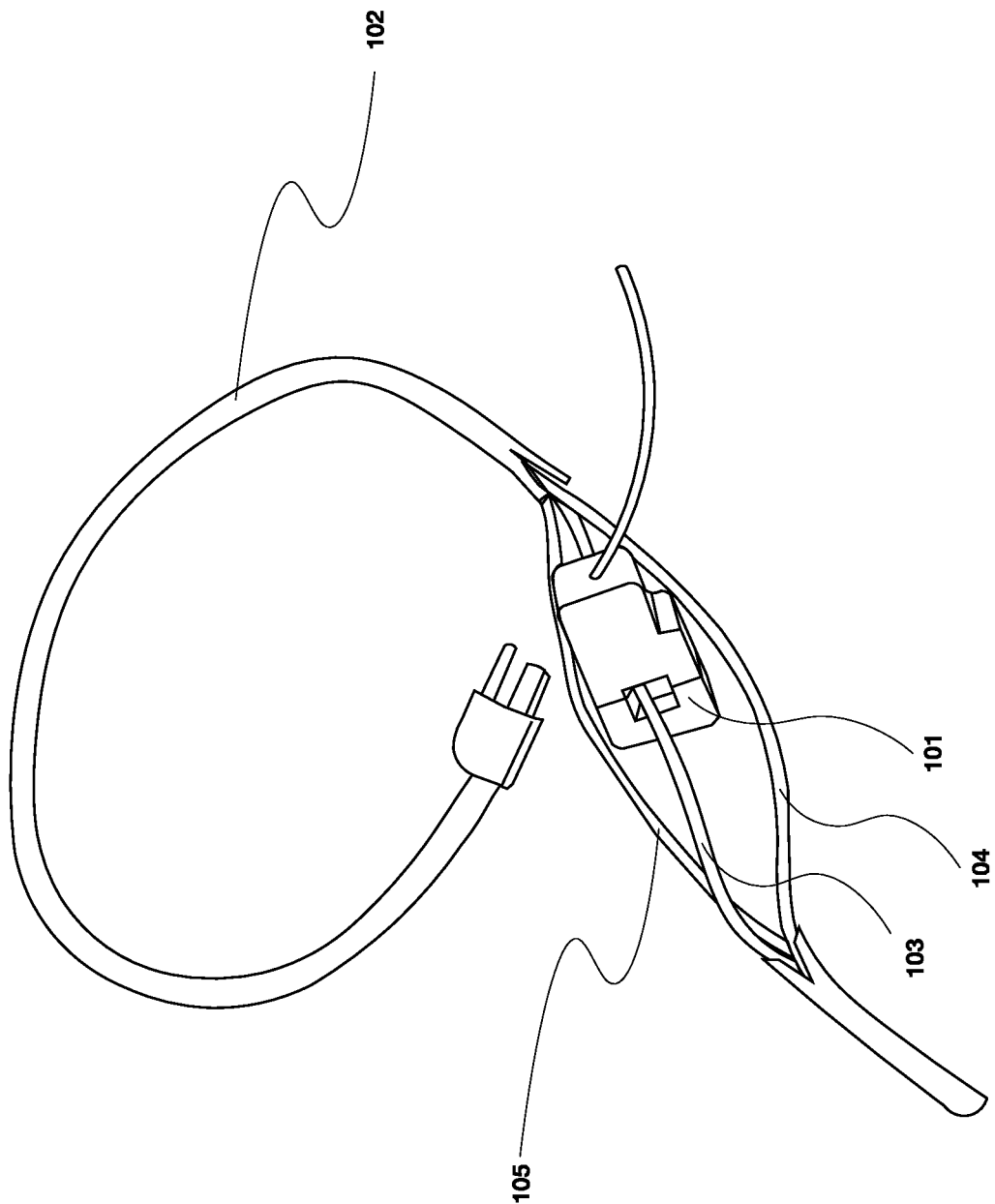
FIG. 1 shows a power cord assembly of the prior art.

Sensor Design, Placement, and Methods for Getting Preferred Raw Signal:

The present Inventors have discovered that an electromagnetic field and signal varies over the length of an electrical conductor (e.g. a power cord) for various reasons. Some conductors are shielded from electromagnetic (EM) transmission. First, while EM shielding is typically not 100% effective, it can greatly reduce the EM signal which can emanate from the conductor when current flows. Furthermore, some conductors such as power cords (generally 3-lead cords) have the internal wires twisted along the length of the cord. See FIG. 1. If the internal wires are further away from the EMA, then there is a reduced signal being measured. Furthermore, since the current is an AC current, it varies with time and can set up a standing wave in the power cord. As such, there are locations of low and high signal along the length of the power cord.

It has herein been discovered that EM signal hotspots occur (e.g. locations where an EMA can measure a higher EM signal) and one can identify and target EMAs to these locations along a conductor/power cord (both along the length and also along the circumference) where the EMA measures higher or lower signals. It is desirable to locate/position an EMA along the power cord at a location that gives off a measurable signal that the EMA can measure. Finding that location can be a challenge since one has to move the EMA along the length and circumference of the cord and at the same time measure the signal from the EMA at each potential location to see where to position it.

Figure 2:
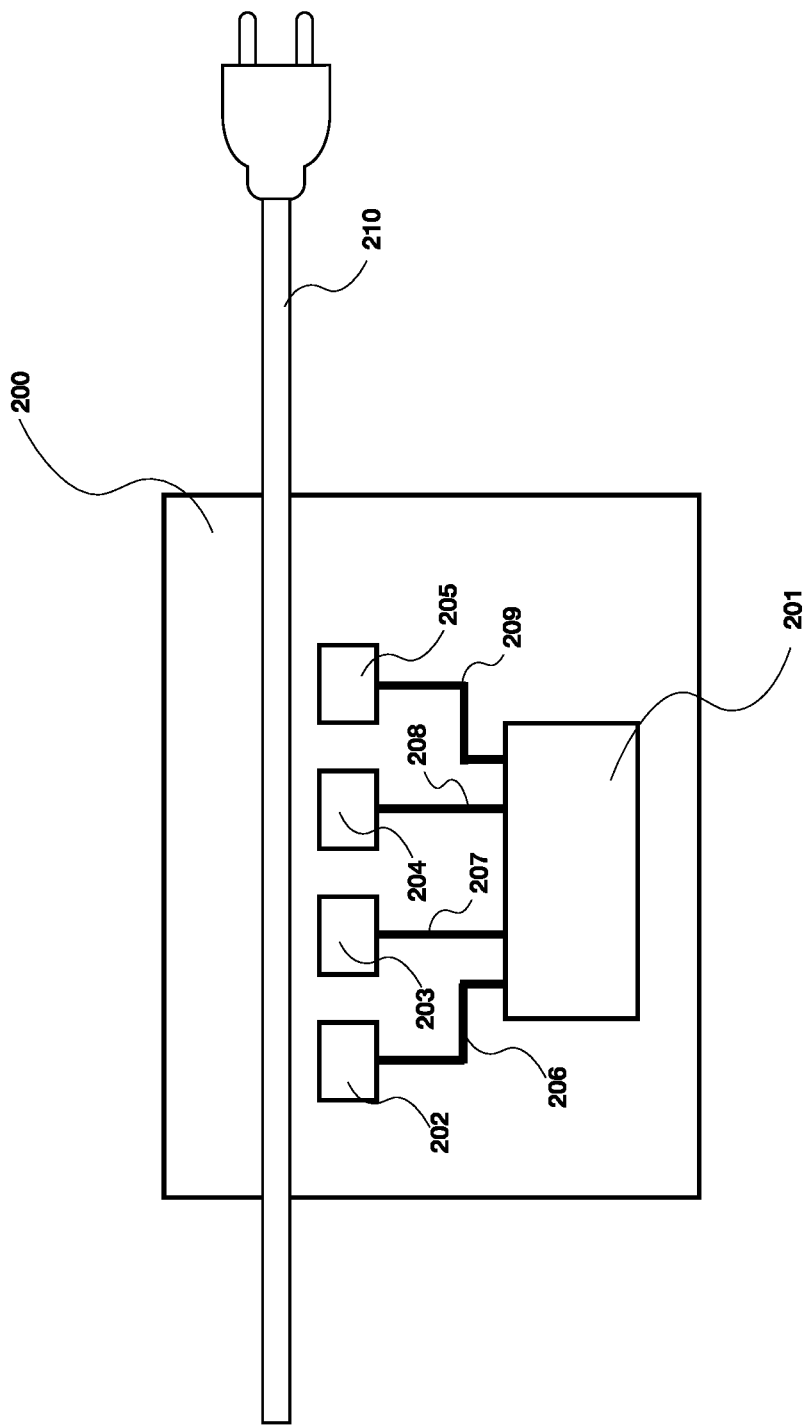

A first embodiment of an apparatus in accordance with the present invention is shown in FIG. 2. In this embodiment, instead of constructing an EMA 200 with a single EMS (which can pick up a signal only in one location), the present invention provides an EMA that has a plurality (two or more) EMSs disposed in an array across at least one of a length and/or a width (e.g. or in a radial or circumferential direction) about the EMA and hence a conductor such as a cord/wire when associated with said cord/wire. The present invention makes use of at least two EMSs and preferably multiple EMSs, positioned in different locations in an array about the EMA.

In this embodiment an electromagnetic apparatus (EMA) 200 for measuring electromagnetic properties of a conductor/power cord 210 providing power to a machine is attached to the cord 210. The EMA has a plurality of electromagnetic sensors (EMSs) 202, 203, 204, 205 disposed in a linear array along a length and a width of the EMA 200. The EMA also has circuitry 201 comprising a microprocessor, communication circuitry, and power circuitry, wherein the circuitry is in electrical communication with the EMSs. When EMA 200 is associated with on the length the conductor (here power supply cord 210), this is considered to be an electromagnetic (EM) measurement system. The present invention likewise provides a method of attaching EMA 200 to a conductor (e.g. power cord 210) and a method of forming the EM measurement system. These methods include the steps of: attaching EMA 200 along the length of a conduction such as power cord 210 supplying power to a machine.

As shown in the preferred embodiment of FIG. 2, an EMA 200 with plurality of EMSs (here four separate EMSs 202, 203, 204, 205), and supporting circuitry 201, comprising a microprocessor, analog and digital converters, conditioning circuitry, communication circuitry, and power circuitry (all not shown) are disposed with a backing layer or substrate. EMSs 202, 203, 204, and 205 are in electronic communication with supporting circuitry 201 via electronic conductor buses 206, 207, 208, 209, respectively, where each of these electronic conductor buses is comprised of at least two separate conductors. Some EMS require each conductive bus to be comprised of at least three separate conductors (for example, one to connect to the power input pin of the EMS, one to connect the ground pin of the EMS, and one to connect to the signal output pin of the EMS). One advantage of the embodiment shown in FIG. 2 where EMSs 202, 203, 204, 205 are all aligned along one line is that this design is more accommodating to power cords of different dimensions.

It is preferred to have at least 2 EMSs (more preferably 3, 4, 5, 6, 10 or more EMSs) disposed within a single EMA device. One embodiment is to position all EMSs (202, 203, 204, 205) in a single linear array (e.g. a line where each EMS is offset from each other along the length of the EMA as shown in FIG. 2). Here, a conductor/power cord 210 can be placed to run along and in proximity to the linear array of EMSs (202, 203, 204, 205).

Figure 3:
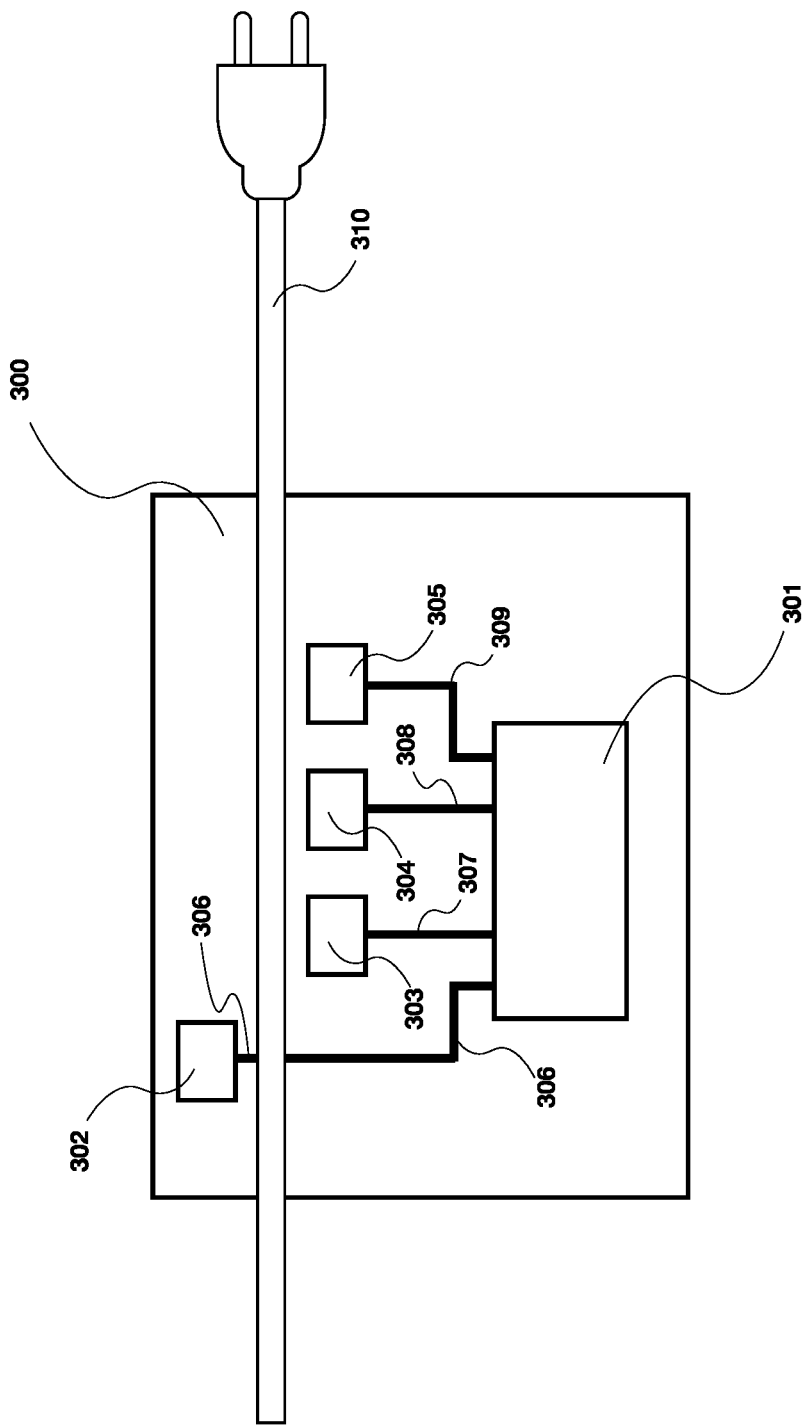

In another embodiment shown in FIG. 3, at least one of the plurality EMSs is offset along the width of the array from the other EMSs. FIG. 3 shows an EMA 300 with four separate EMSs (302, 303, 304, 305), and supporting circuitry 301, comprising a microprocessor, analog and digital converters, conditioning circuitry, communication circuitry, and power circuitry (all not shown). EMSs 302, 303, 304, and 305 are in electronic communication with supporting circuitry 301 via electronic conductor buses 306, 307, 308, 309, respectively, where each of these electronic conductor buses is comprised of at least two separate conductors. Some EMS require each conductive bus to be comprised of at least three separate conductors (for example, one to connect to the power input pin of the EMS, one to connect the ground pin of the EMS, and one to connect to the signal output pin of the EMS). In this embodiment, EMSs 302, 303, 304, 305 are disposed in an array where one EMS 302 is offset along the width of the array from the other EMSs in such a way as to have power cord 310 (when present) run between EMS 302 and the set of other EMSs (303, 304, 305). Stated differently EMS 302 is positioned on a different circumferential side of the power cord than the set of other EMSs (303, 304, 305) when the EMA is associated with the power cord.

Figure 4:
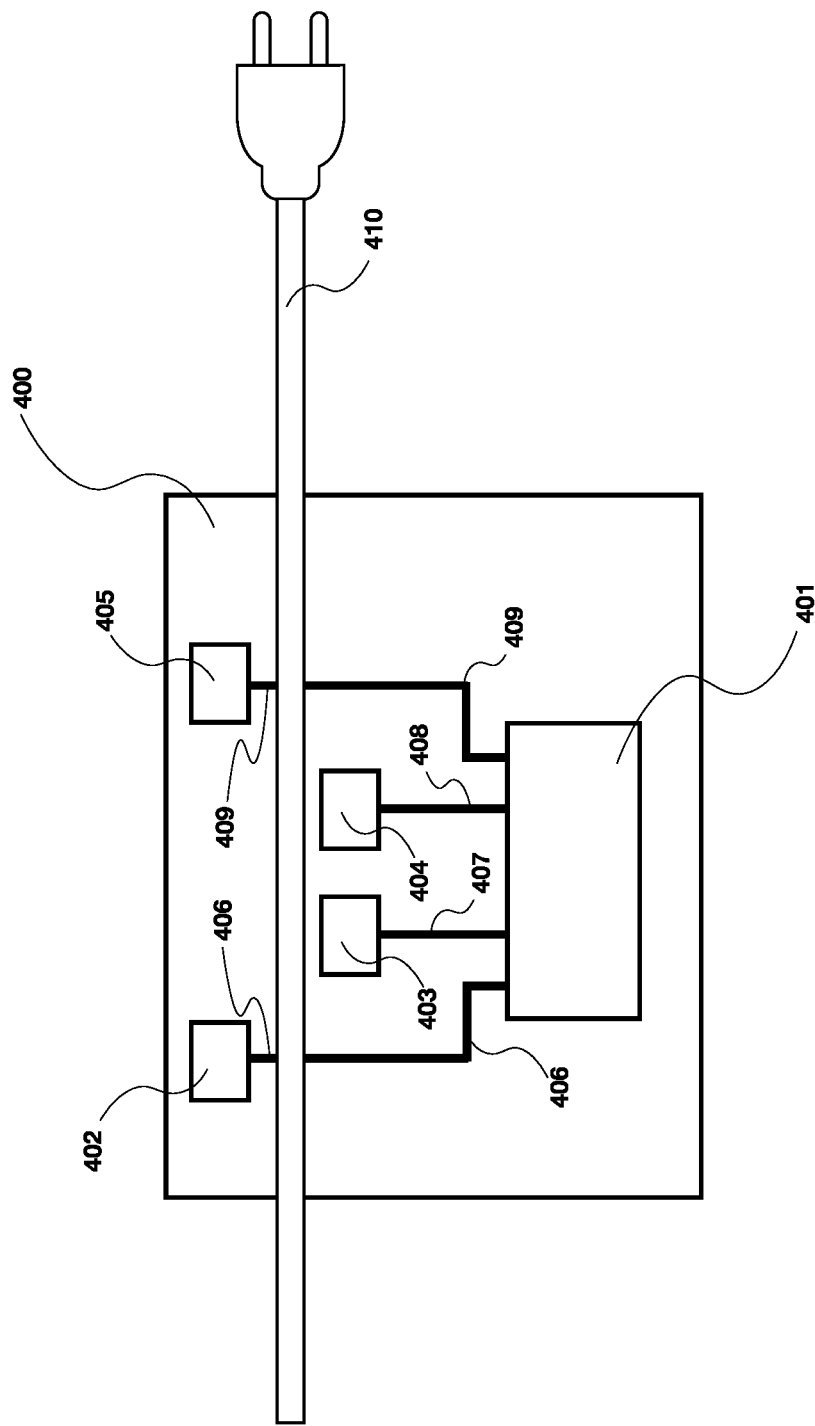

FIG. 4 shows another embodiment where two EMSs (402, 405) are offset along the width of the array from the other two EMSs (403, 404). FIG. 4 shows an EMA 400 with four separate EMSs (402, 403, 404, 405), and supporting circuitry 401, comprising a microprocessor, analog and digital converters, conditioning circuitry, communication circuitry, and power circuitry (all not shown). EMSs 402, 403, 404, and 405 are in electronic communication with supporting circuitry 401 via electronic conductor buses 406, 407, 408, 409, respectively, where each of these electronic conductor buses is comprised of at least two separate conductors. Some EMS require each conductive bus to be comprised of at least three separate conductors (for example, one to connect to the power input pin of the EMS, one to connect the ground pin of the EMS, and one to connect to the signal output pin of the EMS). In this embodiment, the EMSs (402, 403, 404, 405) are not all placed in line with each other. Instead two EMSs 402 and 405 are offset in such a way as to have power cord 410 run between EMS 302 and 405 and the set of other EMSs (303, 304).

FIGS. 5A-5D show four different scenarios that illustrate the advantage of having all the EMSs in one line. In FIG. 5A, a cross sectional view of an embodiment is provided where at least one EMS (503 and 504) is on either side of a large-diameter conductor/power cord 502. Substrate support 501 is provided on which the EMSs are positioned.

FIG. 5A can be the cross-sectional view of either the embodiment shown in FIG. 3 or FIG. 4. In FIG. 5A, the distance (505 and 506) between each EMS (503 and 504) is shown, respectively. Each EMS is responsive to the strength of the electromagnetic field emitted from power cord 502 and the strength of the electromagnetic field decreases as the distance increases. Thus it is desirable to place EMSs close to the power cord.

FIG. 5B shows a small-diameter conductor/power cord 509. The distance between the power cord and each of the EMSs (503, 504) is larger than in FIG. 5A (shown by 507 and 508). Thus, with a smaller-diameter power cord 509, the electromagnetic field that is measured by EMSs 503 and 504 will be lower than in the scenario of FIG. 5A.

FIGS. 5C and 5D illustrate the scenario where all the EMSs are placed along one line, which corresponds to a cross-sectional view of the embodiment of FIG. 2. In both FIGS. 5C and 5D, we see that both the large conductor/power cord 502 and the smaller conductor/power cord 509 can both be aligned next to the line of EMSs 510. This means that the distance 511 between EMS 510 and the large diameter cord 502 is closer in magnitude to the distance 512 between EMS 510 and the small diameter power cord 512. This then means that the EMSs 510 in a line will be able to measure a more reliable and stronger electromagnetic signal from power cords of different diameters.

In another embodiment a flex circuit and/or substrate is provided so that the EMSs can be wrapped around (or otherwise conform to) a conductor/cord at least partially. This provides better contact of EMSs to different diameter conductors/power cords. FIGS. 6A and 6B illustrate this concept. In both FIGS. 6A and 6B, a flexible circuit and/or substrate 601 has a linear array of EMSs, one of which is shown 603. Both a large diameter power cord 602 and a small-diameter power cord 604 are shown, and the EMA can be wrapped around it the flexible substrate 601 that has a EMS 603 on it, thereby providing good contact and minimal distance gap between a EMS and a power cord. In FIG. 6C we see the same thing but with two EMSs offset along the width of the EMA Additional Ways to Accommodate Different Diameter Power Cords and to Facilitate Quick Attachment:

The embodiments described in this section can employ several design features to accommodate cords of different thicknesses/diameters. The design features include inter alia Cylindrical embodiments: Housing/Sleeve that slides over the EMA and cord; Rubber bands and other flexible straps; Different size inserts for use with the EMA; etc.

Figure 7:
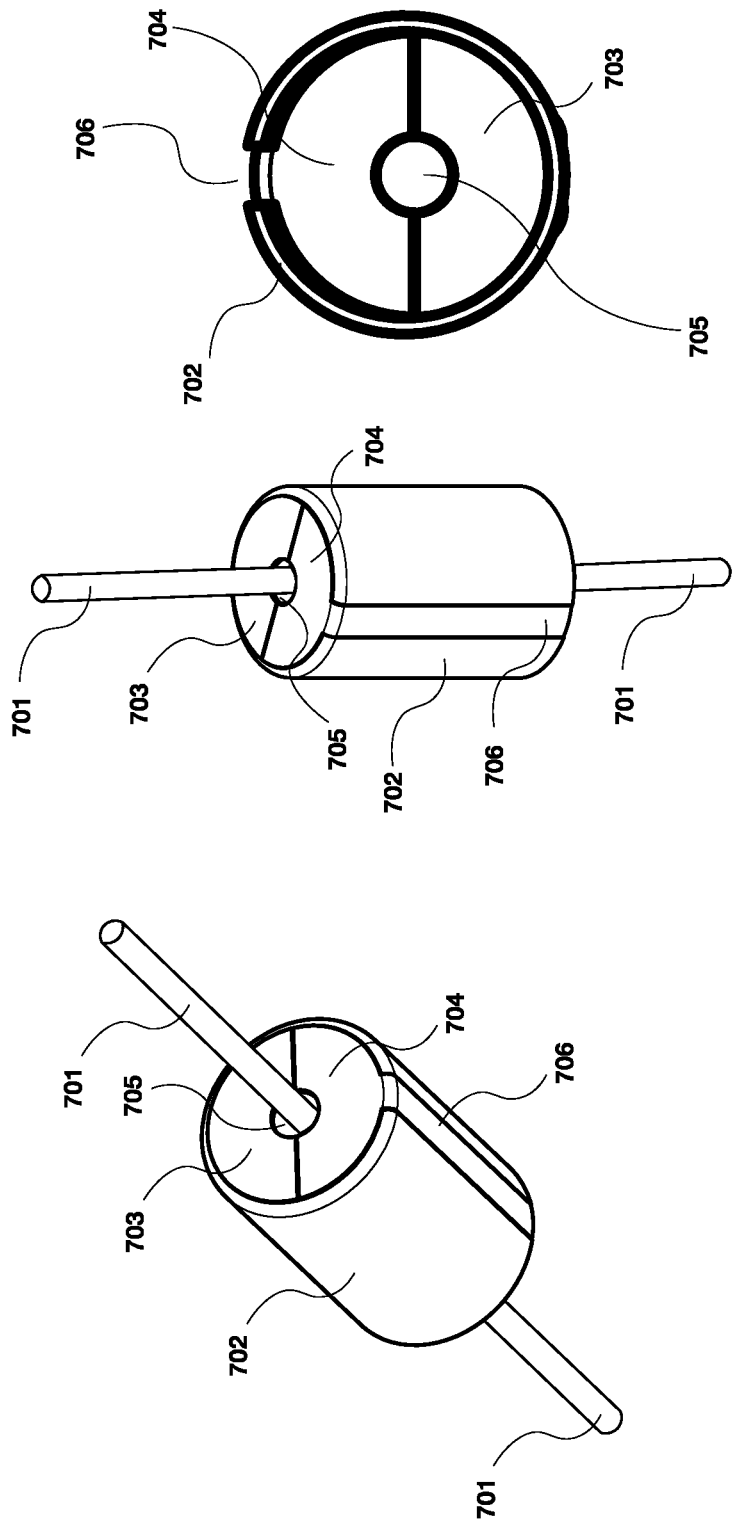

FIG. 7 shows one such embodiment. Here, the EMA has a cylindrical housing comprising sleeve 702 and two inner halves 703 and 704. Inner halves 703 and 704 when engaged with each other form a cylindrical shape which then interact with cylindrical sleeve 702 to for a combined EM measurement system when a power cord is received within the EMA. The power cord 701 passes through a cylindrical cavity/space 705 between two inner half bodies 703 and 704 and within sleeve 702. FIG. 7C shows a cross section without the power cord. In this embodiment sleeve 702 works in communication with two inner halves 703 and 704 which have a semi-cylindrical cavity/channel or other recessed portion configured to accommodate a conductor/power cord. Sleeve 702 can be axially dislodged from the two inner halves 703 and 704 which can then separate for insertion or removal of the power cord 701 which can likewise be received through opening 706 of the sleeve 702. Sleeve 702 has a spring-like tension sufficient such that it grips the two halves 703 and 704 and biases the EMSs (not shown toward the power cord 701.

FIG. 8 shows exploded view of an embodiment similar to that of FIG. 7. Here, sleeve 801 has a gap 810 for the power cord to travel radially into the internal space of the sleeve 801. Inner half body 802 has a cavity 806 for batteries 804 and 805 and is attached to face unit 807. Face unit 807 has a channel 809 to accommodate a portion of a power cord. Inner half body 803 has a raised portion 811 which is designed to interact with opening 810 of sleeve 801 to discourage movement after installation. In practice, raised feature 811 can be on either inner half body 803 or 802. Half body 803 is attached to face plate 808 which also has a channel 812 to accommodate a portion of a power cord. The dimensions of the channels 809 and 812 can be sized to fit different diameter conductors/power cords. In this embodiment, the electronics are housed in the inner half with a battery (or any other power supply such as AC or DC power), that is within inner half body 802. EMSs are positioned along the inner face of faceplate 807 along the channel 809. This can be done either with a flex circuit or with a rigid circuit board.

FIG. 9 shows two embodiments of how to place a set of EMSs in an array along a length and width of a faceplate of the EMA. FIG. 9A shows one embodiment where faceplate 901 has a channel 902 to accommodate at least a portion of a power cord. Along a planar surface 905 of faceplate 901, a set of EMSs 903 are in a linear array near the channel 902 on support 907. Either a flexible or rigid circuit board may be used as support 907. The supporting electronics and conductors are not shown in this figure for the sake of clarity.

FIG. 9B shows another embodiment where faceplate 901 has a channel 902 to accommodate at least a portion of a power cord. Along the surface 906 of the channel 902 of faceplate 901, a set of EMSs 904 are arranged in a linear array such that they are in proximity to where the power cord will be placed (in channel 902). These EMSs 904 are arranged in a linear array on a flexible circuit board 908 which can curve around the shape of channel 902. The supporting electronics and conductors are not shown in this figure for the sake of clarity.

In most preferred embodiments, it is preferred that once the EM measurement system (the combination EMA and the power cord) has been formed, the power cord is prevented from moving with respect to the EMA and its respective EMSs. In order to achieve this functionality, magnets can be mounted on the respective faceplates such that the face placed are biased to each other and the power cord such that the power cord is pinched between the face plates/inner halves. In another embodiment, the inner halves and outer sleeve can be formed in interacting conical shapes such that the force used to slide the sleeve over the inner halves biases the inner halves and their respective channels toward each other and the inserted power cord so as to grip the power cord tightly. It is also possible to increase the coefficient of friction within the respective internal channels such as to increase resistance to move of a power cord receive within the internal channels. Non-limiting ways to increase friction include inter alia: coating the exposed surface of the channel with material that has a high coefficient of friction, like rubber paint; Adhering a layer of rubber or other gripping material to the channel; texturing the surface of the channel with bumps or small spikes or ridges; making these spikes and/or ridges pointy enough to bite in to the plastic/rubber material of a power cord but not the metal of the wires itself.

FIG. 10 shows another embodiment of an EMA to accommodate cords of different diameter and one that uses an off-center cylindrical structure (for example a cam) 1004 that allows for a power cord 1007 of different diameter to be physically held in place by pressure and friction. End caps 1002 and 1003 have cams 1004 and 1008, respectively, and respective openings 1005 and 1009 for receiving power cord 1007. Internal structure 1001 contains the electronics and EMSs (not shown) needed for measuring the electromagnetic (EM) fields from the power cord 1007. End caps 1002 and 1003 rotate around the center point 1010 and around internal structure 1001. Internal structure 1001 has an opening 1006 to received power cord 1007. Opening 1004 in end cap 1002, opening 1009 in end cap 1003, and opening 1006 in internal structure 1001 can all align in an power cord insertion configuration of the EMA such that power cord 1007 can be received within the internal space of the EMA. Since cam 1004 is off center, as end caps 1002 and 1003 are rotated around internal structure 1001 after power cord 1007 has been received within opening 1006, the power cord 1007 can be tightly wedged against edge 1011 of internal structure 1001. EMSs (not shown) are placed in proximity to edge 1011 within internal structure 1001; thus different diameter power cords may be accommodated and positioned tightly against edge 1011 in proximity to the EMSs.

FIG. 11 shows an end view of the embodiment of FIG. 10. FIG. 11A shows the power cord insertion configuration of the EMA where end cap 1101 (dotted line) and internal structure 1102 (solid line) are aligned to provide opening 1104 for power cord 1107 to be inserted. End cap 1101 has a cam feature 1103 that is eccentric from center axis 1106. EMSs are placed along a surface defined by edge 1105 (not visible in this end view) of inner structure 1102. Inner structure 1102 is comprised of curved inner surface 1110.

FIG. 11B shows power cord 1107 after insertion. End cap 1101 is rotated around axis 1106 to the point where power cord 1107 is adjacent to edge 1105 and is pressed against inner surface 1110, ensuring close proximity to EMSs positioned along the surface defined by edge 1105. FIG. 11C shows a power cord 1108 that is smaller in diameter than power cord 1107. In this case, end cap 1101 can be further rotated. Cam 1103 continues to push power cord 1108 against the inner surface 1110 of inner structure 1102 until it is adjacent to edge 1105, thereby ensuring proximity to EMSs. FIG. 11D shows a power cord 1109 that is further smaller in diameter than power cord 1108. In this case, end cap 1101 can be further rotated. Cam 1103 continues to push power cord 1109 against the inner surface 1110 of inner structure 1102 until it is adjacent to edge 1105, thereby ensuring proximity to EMSs. Thus, this cam-based embodiment can accommodate power cords of different diameters and securely hold them in proximity to EMSs that are located long an inner surface of inner structure 1102 that is bounded by edge 1105.

FIG. 14 shows another embodiment for an EMA housing which securing holds the power cord within the EMA thereby forming a secure EM measurement system. Outer sleeve 1402 comprises a hinge 1405 that allows for opening and closing of the EMA about a hinge axis which is parallel to the length of the cord received therein. Hinge 1405 can be a physical hinge mechanism, or preferably a living hinge or other flexure bearing as known in the art. Outer sleeve 1402 holds two inner halve parts 1403 and 1404, each with a curved surface (internal channel) 1406 and 1407, respectively, that can accommodate a portion of a power cord. Either or both 1403 or 1404 is comprised of the EMSs and supporting electronics, which are not shown in these figures. The EMSs are located on either or both of the curved surfaces 1406 or 1407. Power cord 1401 is placed in the cavity created by curved surfaces (internal channels) 1406 and 1407 and hinge means 1405 is closed in order to grip power cord 1401 inside the cavity created by curved surfaces 1406 and 1407. The curved surfaces (internal channels) 1406 and 1407 can be configured with the friction enhancement features described above with respect to FIGS. 7-9, etc.

Methods for Calibration, Use and Determination/Detection of if and when the EMA has been Moved, Jostled or Tampered with:

Once the EMA is attached to a power cord and the EM system has been formed, the EM system can be calibrated to ensure detection and receipt of useful signal. Since the position of the EMA on the power cord can affect the magnitude of the measured signal, calibration of the system is important. Specific challenges with calibration and associated solutions are herein described.

In preferred embodiments, a calibration process includes the following steps: Connect/attach the EMA system to a power cord; Measure the signal under different operating conditions of the machine (e.g. When it is unplugged from wall power; When it is plugged in but in an off state; When it is plugged in but in a sleep state; When it is plugged in and in one operating mode; When it is plugged in and in a second operating mode; When it is plugged in and in another operating mode, etc.); Quantify the measured signals from these different modes and assign a useful label to these modes (e.g. "Unplugged"; "Off"; "Sleep"; "Low power mode"; "Medium power mode"; and "High power mode" etc. Note that Other labels can be more specific and/or quantitative, such as wherein the machine is a centrifuge: "2500 RPM"; "5000" RPM; "Refrigeration On"; "Pump On"). Furthermore, there may exist a mathematical relationship between the power used by the machine and a signal measured by the EMAs; such a relationship can be linear or nonlinear. This relationship can be used to create a calibration curve that can be used to estimate a useful numerical quantity associated with the machine's operation. For example, the rotation rate for a centrifuge in RPMs, or the frequency of compressor cycles in a refrigerator or freezer. However, the calibration of these signals is dependent on the placement/location of the EMAs, and if the EMAs are moved, then the measured signals can be different for the same machine operation power draw, rendering the calibration to be incorrect. Thus a way to deal with the EMA being knocked/jostled/moved/etc is needed.

Once the EM measurement system is calibrated, if the EMA is moved (e.g. accidentally knocked, jostled, or otherwise tampered with etc) then the resulting signals received during operation of the device can differ from the resulting calibration information. There is thus a need for a way to determine if the EMAs have been moved. The present invention provides such a method by purely by looking at the sensor signals over time.

In machines where there are a finite number of known operating states (e.g. off, level 1, level 2, level 3), it would be expected that each EMS in the array on the EMA will measure a signal level at that location that is associated with one of the known states. If at least one EMS measures a signal at its location that is not at a level that is associated with one of the known states, then it can be inferred that movement of the EMA may have occurred and an alert or notification can be sent to a user. This method can be employed where there are any number of known operating states, but it is preferred to be employed when there are two known states (e.g. off/sleep and on/running) since they can be distinguished easily.

Figure 12:
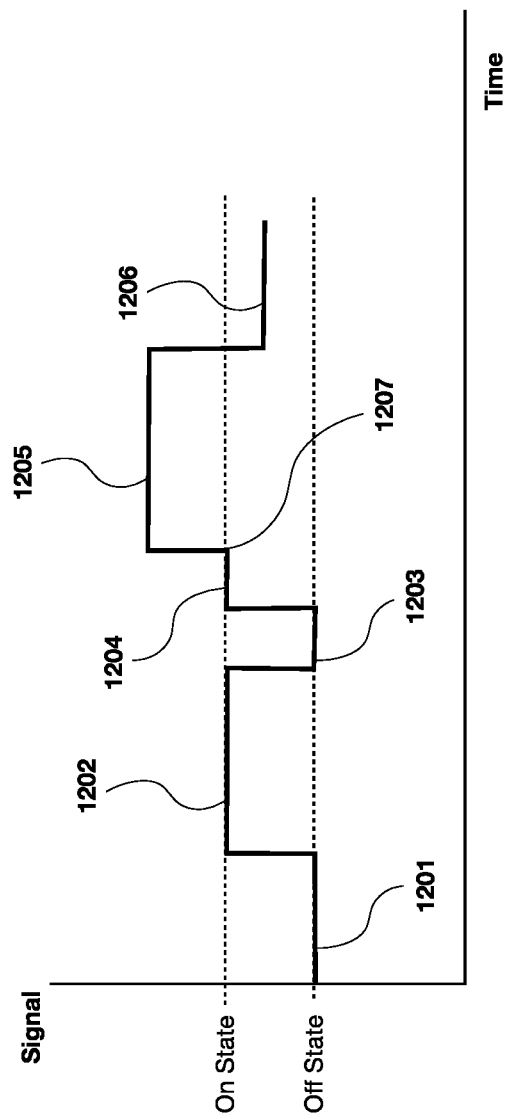

FIG. 12 illustrates such an embodiment. Here, there are two known states for the signal output of an EMS. A measure of the EMS output is shown such that signal portion 1201 indicates that the machine being measured is in the off state; signal portion 1202 indicates that the machine is in its on state; then the machine returns to its off state as shown by signal portion 1203; then the machine is again in its on state 1204. However, next, the signal rises to a new higher level 1205 which does not correspond to any known state; then it falls back down to level 1206, which also does not correspond to a known state. Thus from these signal values, it can be determined that at a time corresponding to point 1207, the EMA was moved to a new location on the power cord and thus the measured signal values no longer are properly calibrated. At this point an alert and/or alarm can be generated and sent to a user.

In other embodiments, the machine being monitored does not have finite defined operating states, but rather can be run in a variety of states that span a continuum. One example of this is a centrifuge, which can have many different rotation rates, refrigeration states, etc. In such a case, one way to determine whether the EMA has been moved is to observe the characteristics of a baseline signal. FIG. 13 provides illustrates this.

As shown in FIG. 13, there is a threshold signal level 1301 below which the signal can be assumed to be a baseline signal (i.e. machine is either off or in sleep state), as shown by signal portion 1302. Then, the machine starts to operate and the signal rises above the threshold 1301 and assumes a number of different values as shown by signal portion 1303 (between time 1307 and 1308). Then the signal returns below threshold 1301 and resumes a baseline value 1304, indicating that the machine has returned to its baseline state. Then the signal rises again to 1305, indicating the machine is again in use. However, next, the signal falls to a level 1306 that is below threshold level 1301, but is also different from normal baseline level 1302, indicating that the EMS has likely moved to a new location on the power cord. At this point an alert and/or alarm can be generated and sent to a user.

Even if sensors get moved/jostled, the present invention provides ways to increase the robustness of the system so that it can be more resistant to movement errors. Here, one increase robustness of the system by checking the signal from each of the EMSs over time (can be periodically or at time intervals that are not periodic) and keep selecting/using the signals from the one that has the maximum signal (or, preferably, maximum signal that is not saturated). One can also combine the signals from multiple EMAs in a mathematically useful way (e.g. the mean signal strength, the median signal strength, etc.). One can also choose to reject EMA readings that have saturated and just use the readings from the EMAs that have not saturated. One can also adjust the gains of each EMA reading such that they saturate. Having a saturated signal can be useful if just an on/off classification is needed.

In another embodiment, where the EMA have been associated with the electrical conductor, readings/signals from the individual sensors (EMSs) can be received by a central processor. The central processor then can be programmed with circuitry and instructions for or the methods can further include the steps of reducing (or otherwise turning off) power to an sensor where reduced (or no) signal is observed while at the same time maintaining (or otherwise increasing) power to sensors where stronger signals are observed.

Methods for Analyzing Signals from EMAs and EM Measurement Systems to Determine Insights and Visibility into Specific Applications Exemplary Method of Determination of Utilization of a Machine (e.g. Centrifuge):

A particularly preferred application of the methods and apparatuses as herein described is in the determination of power consumption of a machine or otherwise in the determination of when a machine (i.e. centrifuge) is in use. In addition, it is desirable to determine the operating conditions for the centrifuge. In many industries, including the life sciences, health care, clinical, pharma, and biotech fields, centrifuges are a critical part of the industry. Many high speed and high capacity centrifuges can rotate at more than 15,000 RPM (rotations per minute) and as such must be maintained at a high level of performance. These can cost more than $10,000, with higher-end models costing over $50,000. After certain amount of use, the rotors need to be maintained and repaired. These maintenance activities can be costly, and often these are scheduled based on time intervals (e.g. once a year). However, such maintenance schedules do not take into account the usage of the centrifuge. Depending on usage, the centrifuge may need maintenance sooner or later than the time-based scheduled maintenance. Many of these centrifuges do not have any means for gathering the usage data directly, so the method and apparatus of the invention can be used to estimate usage metrics associated with a centrifuge to allow for maintenance to be scheduled when needed rather than purely on a time-based schedule that does not account for actual usage.

The present invention provides a method for estimating usage (on/off) of a machine (e.g. centrifuge for example). This method could be employed with any machine, however the present example is performed for exemplary purposes using a centrifuge.

Figure 15:
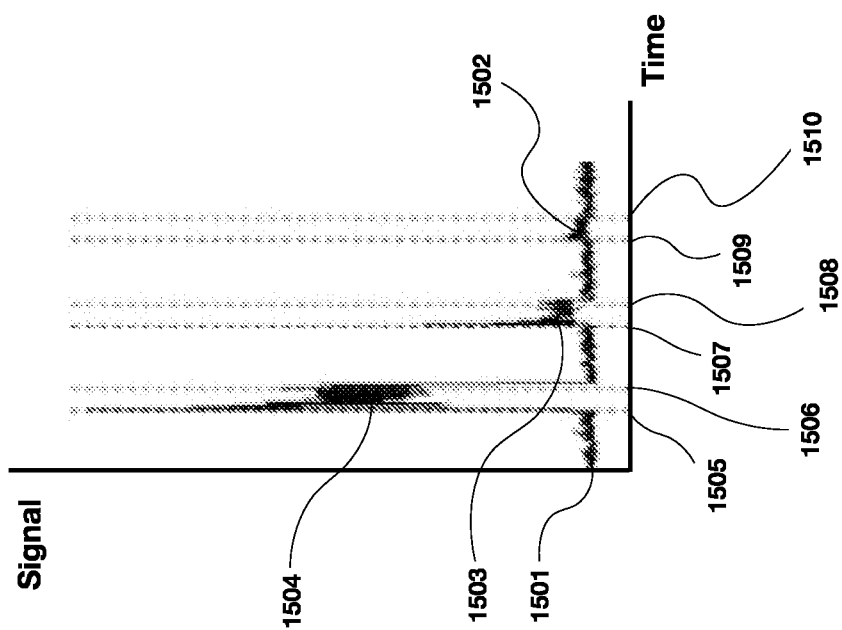

FIG. 15 shows a plot of a signal over time measured by an EMA that has been associated with a conductor/power cord of a centrifuge. Signal portion 1501 shows a baseline signal for when the centrifuge is not in use. Signal portion 1502 shows a signal for when the centrifuge is in a low RPM operation, for example 1000 RPM. Signal portion 1503 shows a signal for when the centrifuge is in a medium RPM operation, for example 3000 RPM. Signal portion 1504 shows a signal for when the centrifuge is in a high RPM operation, for example 6000 RPM. At time 1505, the centrifuge is turned up to a high RPM rate; at time 1506 the centrifuge is turned off. At time 1507, the centrifuge is turned up to a medium RPM rate; at time 1508 the centrifuge is turned off. At time 1509, the centrifuge is turned up to a low RPM rate; at time 1510 the centrifuge is turned off. While the signal difference can be seen visually, it is useful to have a mathematical means for determining both the duration of the centrifuge being used and also the RPM that the centrifuge is being run at.

Figure 16:
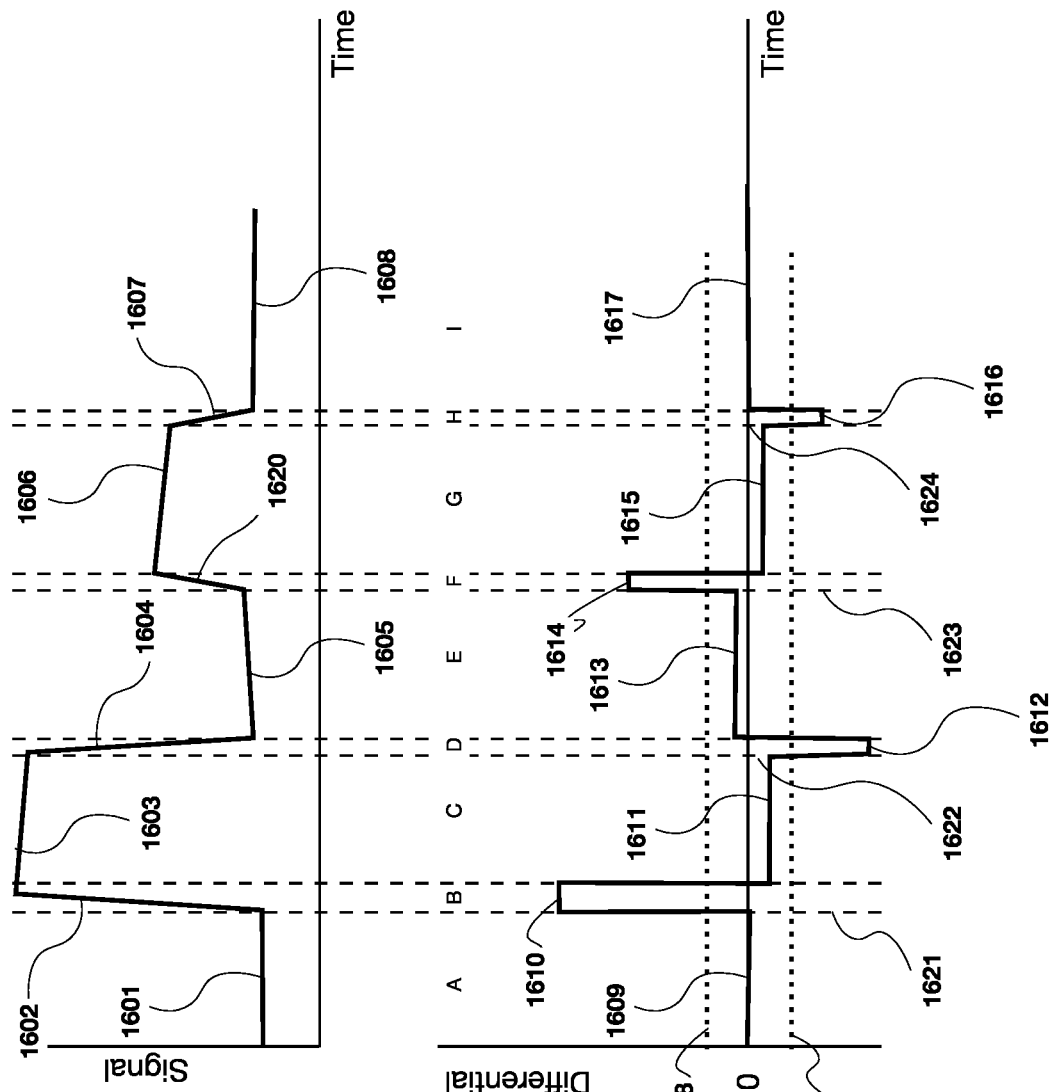

FIG. 16 shows an example embodiment for determining the on and off times, the duration of the operation. In the example of FIG. 16A, the signal generated by the EMA that is monitoring the operation of a centrifuge is shown. Signal portion 1601 during time period A is when the centrifuge is idle, off, or in its non-use state, showing a baseline signal. At the start of time period B, the centrifuge is switched to a high RPM state; during time period B, the EMA signal 1602 increases. At the start of time period C, the centrifuge has reached a high RPM state; during time period C, the EMA signal 1603 remains relatively high, though there may be a slight change of the signal during this time due to the control system of the centrifuge. At the start of time period D, the centrifuge is switched to its idle, off, or non-use state; during time period D, the EMA signal 1604 decreases. At the start of time period E, the centrifuge has reached its idle, or off, or non-use state; during time period E, the EMA signal 1605 remains relatively low, though there may be a slight change of the signal during this time due to signal noise or the control system of the centrifuge. At the start of time period F, the centrifuge is switched to a medium RPM state; during time period F, the EMA signal 1620 increases. At the start of time period G, the centrifuge has reached a medium RPM state; during time period G, the EMA signal 1606 remains relatively high, though there may be a slight change of the signal during this time due to the control system of the centrifuge. At the start of time period H, the centrifuge is switched to its idle, off, or non-use state; during time period H, the EMA signal 1607 decreases. At the start of time period I, the centrifuge has reached its idle, or off, or non-use state; during time period I, the EMA signal 1608 remains relatively low.

One method of determining the start and end times of certain events (for example, when the centrifuge is switched to an running or on state, or when it is switched to an idle, off, or non-use state) is to calculate a differential of the measured signal. For discretely sampled data, this can be done using methods known in the art, for example, by computing a difference between a sample at time t and a sample at time t−1. Additional techniques to filter the signal data prior to computing the differential may be used; such techniques are known in the art and include low pass filters, band pass filters, and high pass filters.

FIG. 16B shows the differential of the signal of FIG. 16A. One example method of determining the duration of an event (for example either when the centrifuge is in the on state or in the idle/off/non-use state) is to determine the time when the differential signal crosses an appropriate threshold level that indicates a transition from idle/off/non-use to an on/run state. In the example of FIG. 16B, differential signal crosses "on threshold" level 1618 at the start of time period B (Time_Event_1_On) 1621 when differential signal portion 1609 increases to differential signal portion 1610. The differential signal crosses "off threshold" level 1619 at the start of time period D (Time_Event_1_Off) 1622 when differential signal portion 1611 decreases to differential signal portion 1612.

A duration of the first run (or "on") event ("Event_1_duration") can be estimated to be the difference Time_Event_1_Off−Time_Event_1_On. Similarly the duration of the next "on/run" event can be calculated by taking the difference between when differential signal portion 1613 crosses "on threshold" 1618 to reach differential signal level 1614 (which occurs at time 1623) and when differential signal portion 1615 crosses "off threshold" 1619 to reach level 1616 (which occurs at time 1624).

Similarly the duration of when the centrifuge is in its idle/off/non-use state can be estimated by taking the difference between the time when the differential signal crosses the "on threshold" level and the time when the differential signal crosses the "off threshold" level (as shown by time region E).

One ordinarily skilled in the art will recognize that the example of a centrifuge discussed here is one of many different possible example embodiments. Indeed, machines and instruments that are able to be switched between an idle/off/non-use state and a run/in-use state in such a manner that creates an increase in current usage in the run/in-use state and a decrease in current usage in the idle/off/non-use state can be analyzed in the manner described by the invention. Furthermore, the threshold levels that determine the transition of the differential signal from one state to another state can be chosen to be suitable for making the distinction between the operating states.

The rotation rate of a centrifuge can be estimated by calibrating the EMA signal to known rotation rates to determine a calibration curve. One ordinarily skilled in the art will recognize that creating a calibration curve is known in the art.

Exemplary Method of Determination the Mode of Operation of a Machine/Instrument (e.g. Detecting Refrigeration Cycles in Centrifuges).

Some machines and instruments have different modes of operation that result in different patterns of current. Being able to identify and/or classify these different patterns of current can be a useful way to gain insight into different operating modes of an instrument or machine. For example, some centrifuges also have temperature control units, such as refrigeration units. These centrifuges are used when a sample being centrifuges needs to be kept at a particular temperature while it is being centrifuged. The present invention provides methods to classify signal portions into different operating modes.

Figure 17:
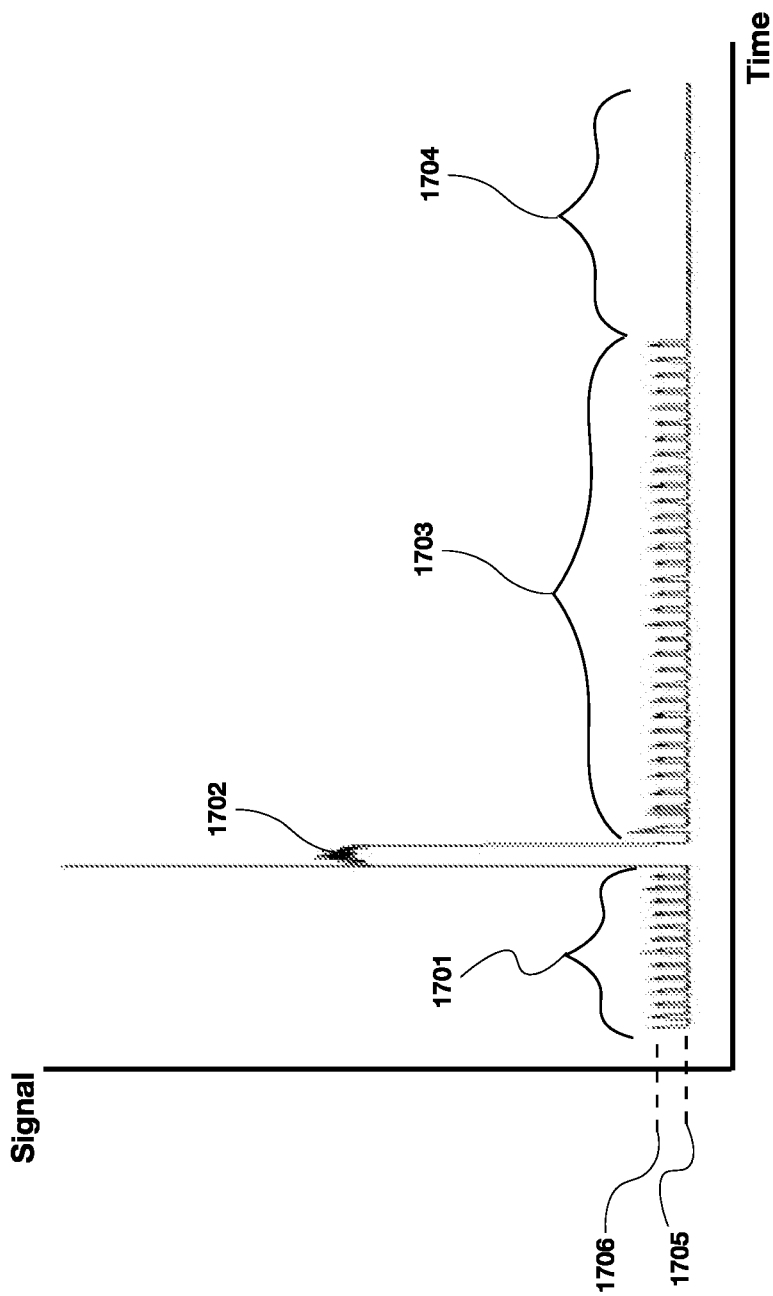

FIG. 17 shows a signal generated by an EMA from a refrigerated centrifuge. Signal portion 1701 and 1703 correspond to a period of refrigeration. The signal shows a series of pulses between approximately signal level 1705 (corresponding to an idle/off/non-use state) and level 1706. Signal portion 1702 shows the centrifuge being run. Signal portion 1704 shows the centrifuge in its idle/off/non-use state.

Here, it can be seen that there is a distinct pattern during the refrigeration phases (1701 and 1703) that is caused by a compressor being turned on and off to maintain a lower temperature. One ordinary skilled in the art will recognize that the use of a compressor to maintain refrigeration is a commonly known method. As described above, a signal differential may be computed to identify the on and off times of the compressor cycles, and subsequently these on and off time can be used to compute the duration, frequency, and/or duty cycles of the compressor.

One ordinarily skilled in the art will appreciate that the duration of compressor cycles in a refrigeration system may not remain constant since the amount of refrigeration that is needed to maintain a desired temperature depends on multiple factors, including the ambient temperature of the environment in which the refrigeration unit is operating, the thermal mass of the contents of the centrifuge, internal heat that may be generated by the operation of the centrifuge, etc.

It is however observable from FIG. 17 that there is nonetheless a visual pattern that may be associated with the centrifuge operating in refrigeration mode (periods 1707 and 1703) as compared with the centrifuge rotation mode (time 1702) and the idle/off/non-use mode (time period 1704). The duration of each compressor cycle is seen to be shorter (e.g. each pulse shown in 1701 and 1703) than the duration of a centrifuge run (1702). Thus, it is possible to identify at least four types of events in a refrigerated centrifuge: 1) the idle/off/non-use state, 2) the compressor being on state, 3) the centrifuge being run in rotation state, and 4) both the compressor on as well as the centrifuge being run in rotation at the same time. The duration of each of these states may be done by the method described above using a differential measurement. However, the challenge still exists to classify each event as one of the above four operating states.

Figure 18:
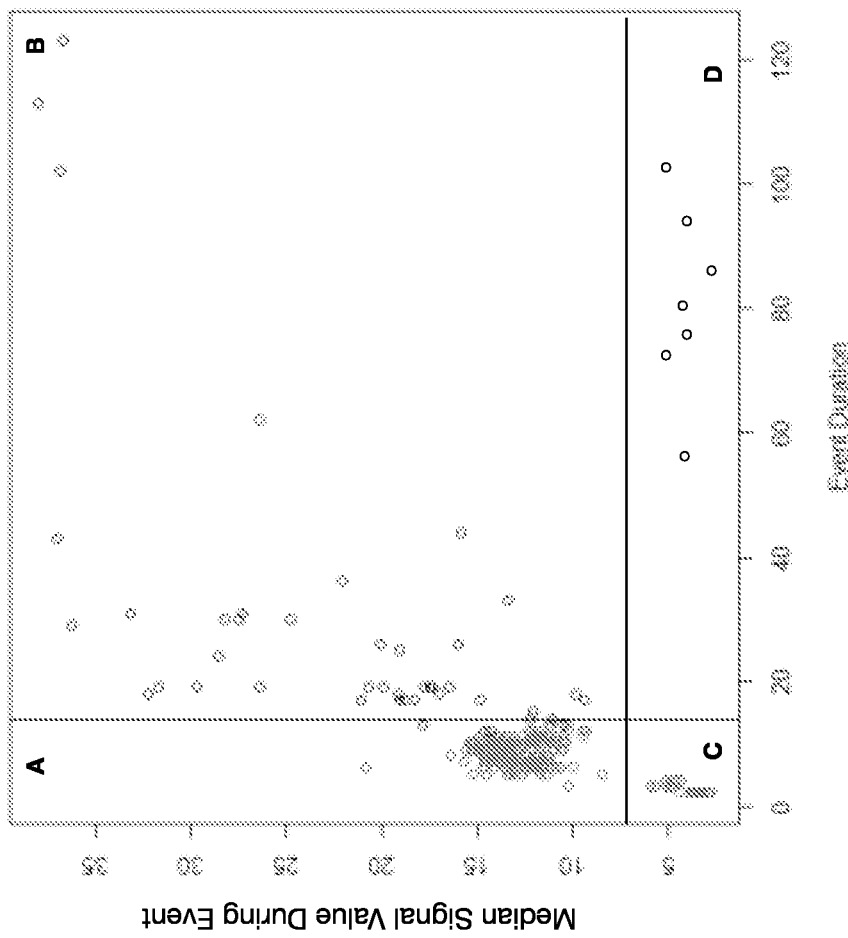

One method of performing this classification is by the use of clustering, as shown in FIG. 18. FIG. 18 shows a clustering of several events (each dot represents one event that has been detected). For each event, there are two parameters: the duration of the event, and the median EMA signal value during that event.

Based on these two parameters, there four general regions that emerge that correspond to different operating states. Region A (generally short duration and generally high signal) corresponds to the compressor being on when the centrifuge is not rotating. Region B (generally longer duration and generally higher signal) corresponds to the centrifuge being run in rotational states. The differences in signal strength may be attributed to different rates of rotation (with higher signals generally corresponding to higher RPM). Region C (generally short duration and generally low signal) corresponds to when the compressor is off between consecutive compressor cycles). Region D (generally long duration and generally low signal) corresponds to when the centrifuge is in its idle/off/non-use state (and also when the compressor is not operating). Thus by identifying different duration of events and comparing the signal during each event, one method of classifying the operating state of an instrument of machine is by the use of clustering.

Preferred Methods of Using the EMA and EM Systems:

A preferred method of using the EMA and EM systems of the present invention are described herein. In a first embodiment the method includes performing a (A) calibration process which includes the following steps: (i) associating an EMA as described anywhere herein along the length of a power cord supplying power to a machine to form an EM measurement system; (ii) operating the machine at a plurality of operating states (e.g. unplugged, plugged in but off, low, high, etc.) and obtaining signal from the EMA during the plurality of set operating states; (iii) quantifying the signals obtained in step (ii) and associating quantified values to the operational state the signal was obtained to form a operating state reference values; (iv) storing the operating state reference values.

In another embodiment, the method includes (B) determining a present operating state of the machine. This includes the steps of: (i) operating the machine in a present operating state (e.g. unplugged, plugged in but off, low, high, etc.) and obtaining an operating signal from the EMA; (ii) quantifying the operating signal obtained in step (B)(i) to form a quantified value of the present operating state of the machine; (iii) comparing the quantified value of the present operating state of the machine with the stored operating state reference values stored in step (A)(iv) to determine a present operating state of the machine.

In additionally preferred embodiments, step (B) further includes the following substeps useful to estimate a suggested machine maintenance time. These includes: (B)(iv) determining the length of time the machine is operated at the present operating state and recording in a computer memory the length of time, (B)(v) performing steps (B)(i) to (B)(iv) a plurality of times over a given time period and then adding the operating time values stored in step (B)(iv) to determine a total length of time the machine was in operation over a given time period; (B)(vi) comparing the a total length of time the machine was in operation over a given time period determined in step (B)(v) to a reference range to estimating a machine maintenance time. This method can further include the steps of providing the estimated machine maintenance time to a user and the user scheduling said maintenance time and/or performing such maintenance.

In further preferred embodiments, step (B) further includes the following substeps useful to estimate a suggested machine maintenance time. These includes: (B)(iv) determining the length of time the machine is operated at the present operating state and recording in a computer memory the length of time at the present operating state, (B)(v) performing steps (B)(i) to (B)(iv) a plurality of times over a given time period and then comparing the operating time values stored in step (B)(iv) to determine variance of the operating time values over the given time period, (B)(vi) comparing the determined variance of the operating time values over the given time period determined in step (B)(v) to a reference range to estimating a machine maintenance time.

In another embodiment, the method includes (C) determining if the EMA has been moved or dislodged from the power cord after its association therewithin step (A)(i) comprising the steps of: (i) operating the machine in a present operating state (e.g. unplugged, plugged in but off, low, high, etc.) and obtaining an operating signal from the EMA; (ii) quantifying the operating signal obtained in step (B)(i) to form a quantified value of the present operating state of the machine; (iii) comparing the quantified value of the present operating state of the machine with the stored operating state reference values stored in step (A)(iv); wherein when it is determined in step (C)(iii) that the quantified value of the present operating state of the machine does not meet or fall within a predetermined range of the stored operating state reference values stored in step (A)(iv), then (iv) determining the EMA has been moved or dislodged from the power cord after its association therewithin step (A)(i). In preferred embodiments, this process includes the further steps of either: (vi) recalibrating the EM system comprising repeating step (A); or (vii) observing EMS signal output from each of the plurality of EMSs and selecting a preferred EMS or combination of preferred EMS. Optionally the process includes the further step of: (D) determining a present operating state of the machine comprising the steps of: (i) operating the machine in a present operating state (e.g. unplugged, plugged in but off, low, high, etc.) and obtaining an operating signal(s) from the preferred EMS or combination of preferred EMSs of the EMA, (ii) quantifying the operating signal(s) obtained in step (B)(i) to form a quantified value of the present operating state of the machine, (iii) comparing the quantified value of the present operating state of the machine with the stored operating state reference values stored in step (A)(iv) to determine a present operating state of the machine. A mathematical function may optionally be applied to the operating signal(s) obtained from the preferred EMS or combination of preferred EMSs of the EMA.

In further preferred embodiments, the present invention further includes the step of (E) Determining a parameter about the machine. This step includes the further substeps of (E)(i) associating an EMA as described in any of claims 1 to 12 along the length of a electrical conductor/power cord supplying power to a machine to form an EM measurement system; (E)(ii) operating the machine at a set operating states (e.g. plugged in but off, low, high, etc.) and obtaining signal from the set operating state; (E)(iii) quantifying the signal obtained in step (ii) to form an operating state reference value; (E)(iv) comparing the operating state reference value to a lookup table to determine an amount of offset from said stored value, thereby determining a parameter of the machine.

In additional embodiments, the present invention provides a method of using an EM measurement system as described herein. The method includes the step of (A) Determining a parameter about the machine. This includes the further substeps of: (i) associating an EMA as described in any of claims 1 to 12 along the length of a power cord supplying power to a machine to form an EM measurement system; (ii) operating the machine at a set operating states (e.g. plugged in but off, low, high, etc.) and obtaining signal from the set operating state; (iii) quantifying the signal obtained in step (ii) to form an operating state reference value; (iv) comparing the operating state reference value to a lookup table to determine an amount of offset from said stored value, thereby determining a parameter of the machine.

In a further amendment the present invention provides programmed computer circuitry comprising instructions for performing the steps of any of the methods herein described. In another embodiment, the present invention provides a system comprising an electromagnetic (EM) measurement system comprising an EMA as described anywhere herein associated on the length of a power cord supplying power to a machine and programmed computer circuitry comprising instructions for performing the steps any of the methods herein described.

It will be appreciated that herein described methods and associated steps can be written and stored as program logic, instructions, software within and performable by well-known computer circuitry and wiring. Accordingly, the present invention likewise provides software, instructions, and programmed computer circuitry (including a processor for executing the instructions) etc. which contains computer logic/instructions performable by computer circuitry and wiring which is capable of performing the methods of the present invention optionally when coupled with an EMA, EMS, and/or EM systems as herein described.

The programmed computer circuitry can be resident within the EMA itself and/or in a device separate from the EMA wherein the EMA is in communication therewith. In certain embodiments the EMA will contain programmed circuitry for performing some or all of the methods steps described herein and the EMA is in a communication with a separate device having programmed circuitry for performing some or all of the method steps described herein. For example, in this later embodiment, the EMA may determining signals from the sensors (e.g. hall sensors) and determine an operating state of the machine. The EMA can then determine when an operating state or power flow of the machine changes (e.g. on/off, high/low, etc.) and then when a change in operation is observed or determined the EMA can then send a signal to the separate device indicating the change in operation. In the interim, the EMA can operate in a low power mode by simply observing signal from the sensors without separately or continuously broadcasting the current operating state of the machine.

In preferred embodiments herein described, the methods and system preferably make use of computer/program/module/node/infrastructure programmed with logic/instructions and having circuitry comprised of hardware, software, memory, processors, data storage, computers, etc. which cause/create/effect operability of said systems and methods. In these embodiments, the present invention provides novel data files stored in a computer, server, data storage facility, etc. Furthermore, and in other embodiments, the present invention provides a printed set of instructions and/or a computer program/module/node programmed with logic and/or instructions performable by a computer processor to perform any method herein described.

In further preferred embodiments, any of the methods and/or steps of the present invention are preferably performed using the EDMSs (e.g. electronic lab notebook (ELN) systems and/or aggregated data systems) and/or methods as described in US Prov. Application entitled "Systems and methods to integrate environmental information into measurement metadata in an Electronic Laboratory Notebook Environment" which received U.S. Provisional Application Ser. No. 62/739,427, and which is incorporated herein by reference for all purposes.

Reference throughout the specification to "one embodiment," "another embodiment," "an embodiment," "some embodiments," and so forth, means that a particular element (e.g., feature, structure, property, and/or characteristic) described in connection with the embodiment is included in at least one embodiment described herein, and may or may not be present in other embodiments. In addition, it is to be understood that the described element(s) may be combined in any suitable manner in the various embodiments.

Numerical values in the specification and claims of this application reflect average values for a composition. Furthermore, unless indicated to the contrary, the numerical values should be understood to include numerical values which are the same when reduced to the same number of significant figures and numerical values which differ from the stated value by less than the experimental error of conventional measurement technique of the type described in the present application to determine the value.

The invention claimed is:

1. An electromagnetic apparatus (EMA) for measuring at least one electromagnetic property of an electrical conductor, the EMA comprising:
   a plurality of electromagnetic sensors (EMSs) disposed in an array along a length, or both the length and a width of the EMA, and
   circuitry comprising a microprocessor, communication circuitry, and power circuitry, wherein the circuitry is in electrical communication with the EMSs,
   wherein the EMA is configured for association with the electrical conductor such that at least two EMSs are offset along the length of the electrical conductor, and
   wherein the EMA comprises a guide path disposed along the length of the EMA, wherein the guide path is configured for guiding the electrical conductor along the length of the EMA, and wherein the plurality of EMSs are disposed adjacent to or within the guide path along the length of the EMA.

2. The EMA of claim 1, wherein the EMSs are offset along the length and the width of the EMA.

3. The EMA of claim 1, wherein the EMA further has a circumference wherein at least two EMSs are offset about the circumference of the EMA, optionally wherein the EMA has an inner circumference and an outer circumference where at least two EMSs disposed on and are offset about the inner circumference of the EMA, and optionally wherein the EMA is disposed on a flexible circuit capable of conforming about the electrical conductor.

4. The EMA of claim 1, wherein the circuitry further comprises analog and digital converters and signal conditioners, and wherein the EMSs are in electrical communication with the circuitry via electronic conductor buses, wherein the electronic conductor buses comprise two separate conductors.

5. The EMA of claim 1, further comprising a housing assembly configured to bias the EMA and/or EMSs toward the electrical conductor.

6. The EMA of claim 5, wherein the housing assembly is cylindrical and comprises a cylindrical enclosure sleeve and two inner semi-cylindrical halves, wherein:
   the two inner semi-cylindrical halves each have a recessed portion for receiving a portion of the power cord and engage with each other to form a cylindrical shaped structure for receiving a power cord within the respective channels and that can be received within the cylindrical enclosure sleeve,
   wherein the recessed portion of either or both of the two inner semi-cylindrical halves comprise a cord-grip device selected from the group consisting of: magnets, rubber, bumps, and ridges,
   wherein the cylindrical enclosure sleeve is configured with a hinge to open the sleeve about a hinge axis parallel to the length of a power cord received therein OR wherein the housing comprises a rotatable cam mechanism which has a power cord hole offset from the axis of the cam mechanism, wherein when a power cord is received within the power cord hole, rotation of the rotatable cam mechanism biases the power cord toward one or more of the plurality of EMSs.

7. An electromagnetic (EM) measurement system comprising an EMA as described in claim 1 associated with an electrical conductor, wherein at least two EMSs are offset along a length or both the length and a width of the electrical conductor.

8. The system of claim 7, wherein the guide path is a channel extending along the length of the EMA and being configured for receiving the electrical conductor along its length and positioning the plurality of EMSs adjacent to or within the channel and along the length of the electrical conductor.

9. The system of claim 7, wherein the electrical conductor comprises a power cord for supplying power to a machine.

10. A method of attaching an EMA to an electrical conductor comprising a power cord for supplying power to a machine comprising the steps of: attaching the EMA as described in claim 1 with the power cord, wherein at least two EMSs are offset along the length or both the length and a width of the power cord.

11. A method of using an EM measurement system comprising the steps of:
(A) calibrating the EM measurement system by employing the steps of:
(i) associating an EMA as described in claim 1 with a power cord for supplying power to a machine to form an EM measurement system, wherein at least two EMSs are offset along the length or both the length and a width of the power cord,
(ii) operating the machine at a plurality of operating states (e.g. unplugged, plugged in but off, low, high, etc.) and obtaining a signal from the EMA during the plurality of set operating states,
(iii) quantifying the signals obtained in step (ii) and associating quantified values to the operational state the signal was obtained to form a operating state reference values, and
(iv) storing the operating state reference values.

12. The method of claim 11, further comprising the step of:
(B) determining a present operating state of the machine comprising the steps of:
(i) operating the machine in a present operating state (e.g. unplugged, plugged in but off, low, high, etc.) and obtaining an operating signal from the EMA,
(ii) quantifying the operating signal obtained in step (B)(i) to form a quantified value of the present operating state of the machine, and
(iii) comparing the quantified value of the present operating state of the machine with the stored operating state reference values stored in step (A)(iv) to determine a present operating state of the machine.

13. The method of claim 12, further comprising a step of estimating a machine maintenance time comprising a combination of steps (B)(iv) to (B)(vi) selected from the group consisting of:
(B)(iv) determining the length of time the machine is operated at the present operating state and recording in a computer memory the length of time,
(B)(v) repeating steps (B)(i) to (B)(iv) a plurality of times over a given time period and then adding the operating time values stored in step (B)(iv) to determine a total length of time the machine was in operation over a given time period, and
(B)(vi) comparing the length of time the machine was in operation over a given time period determined in step (B)(v) to a reference range to estimating a machine maintenance time,
AND:
(B)(iv) determining the length of time the machine is operated at the present operating state and recording in a computer memory the length of time at the present operating state,
(B)(v) performing steps (B)(i) to (B)(iv) a plurality of times over a given time period and then comparing the operating time values stored in step (B)(iv) to determine variance of the operating time values over the given time period, and
(B)(vi) comparing the determined variance of the operating time values over the given time period determined in step (B)(v) to a reference range to estimating a machine maintenance time.

14. The method of any of claim 12, further comprising the step of:
(C) determining if the EMA has been moved or dislodged from the power cord after its association therewith in step (A)(i) comprising the steps of:
(i) operating the machine in a present operating state (e.g. unplugged, plugged in but off, low, high, etc.) and obtaining an operating signal from the EMA,
(ii) quantifying the operating signal obtained in step (B)(i) to form a quantified value of the present operating state of the machine,
(iii) comparing the quantified value of the present operating state of the machine with the stored operating state reference values stored in step (A)(iv),
wherein when it is determined in step (C)(iii) that the quantified value of the present operating state of the machine does not meet or fall within a predetermined range of the stored operating state reference values stored in step (A)(iv), then
(iv) determining the EMA has been moved or dislodged from the power cord after its association therewithin step (A)(i).

15. The method of claim 14, further comprising the steps of either: (vi) recalibrating the EM system comprising repeating step (A), or
(vii) observing EMS signal output from each of the plurality of EMSs and selecting a preferred EMS or combination of preferred EMS.

16. The method of claim 15, further comprising the step of:
(D) determining a present operating state of the machine comprising the steps of:
(i) operating the machine in a present operating state (e.g. unplugged, plugged in but off, low, high, etc.) and obtaining an operating signal(s) from the preferred EMS or combination of preferred EMSs of the EMA,
(ii) quantifying the operating signal(s) obtained in step (B)(i) to form a quantified value of the present operating state of the machine, and
(iii) comparing the quantified value of the present operating state of the machine with the stored operating state reference values stored in step (A)(iv) to determine a present operating state of the machine, optionally wherein a mathematical function is applied to the operating signal(s) obtained from the preferred EMS or combination of preferred EMSs of the EMA.

17. The method of claim 15, further comprising the step of:
(E) Determining a parameter about the machine by employing the steps of:
(i)
operating the machine at a set operating states (e.g. plugged in but off, low, high, etc.) and obtaining signal from the set operating state,
(ii) quantifying the signal obtained in step (ii) to form an operating state reference value,
(iii) comparing the operating state reference value to a lookup table to determine an amount of offset from said stored value, thereby determining a parameter of the machine.

18. A system comprising an electromagnetic (EM) measurement system comprising an electromagnetic apparatus (EMA) for measuring at least one electromagnetic property of an electrical conductor such as a power cord for supplying power to a machine, and computer circuitry comprising instructions for performing the steps of claim 11, wherein:

the EMA comprises: a plurality of electromagnetic sensors (EMSs) disposed in an array along a length or both the length and a width of the EMA; and circuitry comprising a microprocessor, communication circuitry, and power circuitry, wherein the circuitry is in electrical communication with the EMSs; and the EMA is associated with the electrical conductor such that at least two EMSs are offset along the length or both the length and a width of the electrical conductor.

19. The system of claim 18, wherein the guide path is a channel extending along the length of the EMA and being configured for receiving the electrical conductor along its length and positioning the plurality of EMSs adjacent to or within the channel and along the length of the electrical conductor.

20. A method of using an electromagnetic (EM) measurement system, comprising the steps of:
(A) Determining a parameter about a machine by employing the steps of:
(i) associating the length of the EMA of claim 1 along a length of an electrical conductor comprising a power cord for supplying power to the machine to form an EM measurement system, wherein at least two EMSs are offset along the length or both the length and a width of the power cord,
(ii) operating the machine at a set operating state (e.g. plugged in but off, low, high, etc.) and obtaining signal from the set operating state,
(iii) quantifying the signal obtained in step (ii) to form an operating state reference value, and
(iv) comparing the operating state reference value to a lookup table to determine an amount of offset from said stored value, thereby determining a parameter of the machine.

21. The EMA of claim 1, wherein the guide path is a channel extending along the length of the EMA and being configured for receiving the electrical conductor along its length and positioning the plurality of EMSs adjacent to or within the channel and along the length of the electrical conductor.

22. A method of using an EM measurement system comprising the steps of:
(A) calibrating the EM measurement system by employing the steps of:
(i) associating an electromagnetic apparatus (EMA) with a power cord for supplying power to a machine to form an EM measurement system, wherein at least two EMSs are offset along the length or both the length and a width of the power cord,
wherein the EMA is for measuring at least one electromagnetic property of the power cord, the EMA comprising:
a plurality of electromagnetic sensors (EMSs) disposed in an array along a length, or both the length and a width of the EMA, and
circuitry comprising a microprocessor, communication circuitry, and power circuitry, wherein the circuitry is in electrical communication with the EMSs,
wherein the EMA is configured for association with the power cord such that at least two EMSs are offset along the length of the electrical conductor,
(ii) operating the machine at a plurality of operating states (e.g. unplugged, plugged in but off, low, high, etc.) and obtaining a signal from the EMA during the plurality of set operating states,
(iii) quantifying the signals obtained in step (ii) and associating quantified values to the operational state the signal was obtained to form a operating state reference values, and
(iv) storing the operating state reference values,
(B) determining a present operating state of the machine comprising the steps of:
(i) operating the machine in a present operating state (e.g. unplugged, plugged in but off, low, high, etc.) and obtaining an operating signal from the EMA,
(ii) quantifying the operating signal obtained in step (B)(i) to form a quantified value of the present operating state of the machine, and
(iii) comparing the quantified value of the present operating state of the machine with the stored operating state reference values stored in step (A)(iv) to determine a present operating state of the machine,
wherein the method further comprises a step of estimating a machine maintenance time comprising a combination of steps (B)(iv) to (B)(vi) selected from the group consisting of:
(B)(iv) determining the length of time the machine is operated at the present operating state and recording in a computer memory the length of time,
(B)(v) repeating steps (B)(i) to (B)(iv) a plurality of times over a given time period and then adding the operating time values stored in step (B)(iv) to determine a total length of time the machine was in operation over a given time period, and
(B)(vi) comparing the length of time the machine was in operation over a given time period determined in step (B)(v) to a reference range to estimating a machine maintenance time,
AND:
(B)(iv) determining the length of time the machine is operated at the present operating state and recording in a computer memory the length of time at the present operating state,
(B)(v) performing steps (B)(i) to (B)(iv) a plurality of times over a given time period and then comparing the operating time values stored in step (B)(iv) to determine variance of the operating time values over the given time period, and
(B)(vi) comparing the determined variance of the operating time values over the given time period determined in step (B)(v) to a reference range to estimating a machine maintenance time.

23. A method of using an EM measurement system comprising the steps of:
(A) calibrating the EM measurement system by employing the steps of:
(i) associating an electromagnetic apparatus (EMA) with a power cord for supplying power to a machine to form an EM measurement system, wherein at least two EMSs are offset along the length or both the length and a width of the power cord,
wherein the EMA is for measuring at least one electromagnetic property of the power cord, the EMA comprising:
a plurality of electromagnetic sensors (EMSs) disposed in an array along a length, or both the length and a width of the EMA, and
circuitry comprising a microprocessor, communication circuitry, and power circuitry, wherein the circuitry is in electrical communication with the EMSs, wherein the EMA is configured for association with the power cord such that at least two EMSs are offset along the length of the electrical conductor, (ii) operating the machine at a plurality of operating states (e.g. unplugged, plugged in but off, low, high, etc.) and obtaining a signal from the EMA during the plurality of set operating states, (iii) quantifying the signals obtained in step (ii) and associating quantified values to the operational state the signal was obtained to form a operating state reference values, and (iv) storing the operating state reference values, (B) determining a present operating state of the machine comprising the steps of:

(i) operating the machine in a present operating state (e.g. unplugged, plugged in but off, low, high, etc.) and obtaining an operating signal from the EMA, (ii) quantifying the operating signal obtained in step (B)(i) to form a quantified value of the present operating state of the machine, and (iii) comparing the quantified value of the present operating state of the machine with the stored operating state reference values stored in step (A)(iv) to determine a present operating state of the machine, and (C) determining if the EMA has been moved or dislodged from the power cord after its association therewith in step (A)(i) comprising the steps of:

(i) operating the machine in a present operating state (e.g. unplugged, plugged in but off, low, high, etc.) and obtaining an operating signal from the EMA, (ii) quantifying the operating signal obtained in step (B)(i) to form a quantified value of the present operating state of the machine, (iii) comparing the quantified value of the present operating state of the machine with the stored operating state reference values stored in step (A)(iv), wherein when it is determined in step (C)(iii) that the quantified value of the present operating state of the machine does not meet or fall within a predetermined range of the stored operating state reference values stored in step (A)(iv), then (iv) determining the EMA has been moved or dislodged from the power cord after its association therewithin step (A)(i).

24. The method of claim 23, further comprising the steps of either: (vi) recalibrating the EM system comprising repeating step (A), or (vii) observing EMS signal output from each of the plurality of EMSs and selecting a preferred EMS or combination of preferred EMS.

25. The method of claim 24, further comprising the step of:

(D) determining a present operating state of the machine comprising the steps of:

(i) operating the machine in a present operating state (e.g. unplugged, plugged in but off, low, high, etc.) and obtaining an operating signal(s) from the preferred EMS or combination of preferred EMSs of the EMA, (ii) quantifying the operating signal(s) obtained in step (B)(i) to form a quantified value of the present operating state of the machine, and (iii) comparing the quantified value of the present operating state of the machine with the stored operating state reference values stored in step (A)(iv) to determine a present operating state of the machine, optionally wherein a mathematical function is applied to the operating signal(s) obtained from the preferred EMS or combination of preferred EMSs of the EMA.

26. The method of claim 24, further comprising the step of:

(E) Determining a parameter about the machine by employing the steps of:

(i) operating the machine at a set operating states (e.g. plugged in but off, low, high, etc.) and obtaining signal from the set operating state, (ii) quantifying the signal obtained in step (ii) to form an operating state reference value, and (iii) comparing the operating state reference value to a lookup table to determine an amount of offset from said stored value, thereby determining a parameter of the machine.

\* \* \* \* \*